US012782896B2

(12) United States Patent
Kashiwa et al.

(10) Patent No.: US 12,782,896 B2
(45) Date of Patent: Nov. 3, 2026

(54) INFORMATION PROCESSING DEVICE, PREDICTION METHOD, AND COMPUTER-READABLE RECORDING MEDIUM

(71) Applicant: YOKOGAWA ELECTRIC CORPORATION, Tokyo (JP)

(72) Inventors: Ryosuke Kashiwa, Tokyo (JP); Toshiaki Omata, Tokyo (JP); Nobuaki Ema, Tokyo (JP); Yoshitaka Yoshida, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 1048 days.

(21) Appl. No.: 17/824,388

(22) Filed: May 25, 2022

(65) Prior Publication Data

US 2022/0382233 A1 Dec. 1, 2022

(30) Foreign Application Priority Data

May 28, 2021 (JP) ................................ 2021-090279

(51) Int. Cl.
*G05B 17/02* (2006.01)
*G05B 23/02* (2006.01)
*G06F 30/20* (2020.01)

(52) U.S. Cl.
CPC ........... *G05B 17/02* (2013.01); *G05B 23/027* (2013.01); *G05B 23/0272* (2013.01); *G06F 30/20* (2020.01)

(58) Field of Classification Search
CPC .. G05B 17/02; G05B 23/027; G05B 23/0272; G05B 23/024; G05B 2219/31437;
(Continued)

(56) References Cited

U.S. PATENT DOCUMENTS

2005/0043926 A1* 2/2005 Hayzen .................. G01N 15/02 702/188
2005/0240382 A1* 10/2005 Nakaya .................. G05B 17/02 703/6

(Continued)

FOREIGN PATENT DOCUMENTS

JP 5-189679 A 7/1993
JP 2007115176 A 5/2007

(Continued)

OTHER PUBLICATIONS

Ling, Zhou, et al. "Intelligent Alarm Technologies Used for Nuclear Instrumentation and Control System." 2018 International Conference on Power System Technology (POWERCON). IEEE, 2018. (Year: 2018).*

(Continued)

*Primary Examiner* — Michael Edward Cocchi
(74) *Attorney, Agent, or Firm* — RANKIN, HILL & CLARK LLP

(57) ABSTRACT

Regarding each of a plurality of operation patterns virtually generated in regard to the operation performed by a worker with respect to an actual plant, an information processing device uses plant data related to the operation of the actual plant and uses a virtual plant which follows the actual plant, and predicts the state transition of the actual plant in the case of implementing each operation pattern. Then, the information processing device outputs each operation pattern in a corresponding manner to the state transition of the actual plant as obtained by the virtual plant.

14 Claims, 19 Drawing Sheets

(58) Field of Classification Search
CPC .... G05B 2219/32338; G05B 19/41885; G05B 2219/32339; G06F 30/20; G06F 30/25; G06F 30/27; G06F 30/28
See application file for complete search history.

(56) References Cited

U.S. PATENT DOCUMENTS

| | | | | |
|---|---|---|---|---|
| 2013/0147630 | A1* | 6/2013 | Nakaya | G05D 23/00 340/691.6 |
| 2015/0077263 | A1* | 3/2015 | Ali | G05B 23/0218 340/679 |
| 2019/0384240 | A1* | 12/2019 | Seki | G05B 19/41885 |

FOREIGN PATENT DOCUMENTS

| | | | |
|---|---|---|---|
| JP | 2009-009301 | A | 1/2009 |
| JP | 2011-008756 | A | 1/2011 |
| JP | 2013145548 | A | 7/2013 |
| JP | 2017182414 | A | 10/2017 |

OTHER PUBLICATIONS

Japanese Office Action (JPOA) mailed Oct. 3, 2023 issued in Japanese Patent Application No. 2021-090279 and its English machine translation.

Chinese Decision of final rejection mailed on Sep. 3, 2025 for Chinese patent application No. 202210573014.7 with its English machine translation.

* cited by examiner

FIG.3

| SYSTEM 1 | SYSTEM 2 | SYSTEM 3 | ... | SYSTEM N |
|---|---|---|---|---|
| FACILITY A | FACILITY B | FACILITY C | - | - |
| DEVICE X | DEVICE Y | DEVICE Z | - | - |
| | DEVICE Q | - | - | - |
| ... | ... | ... | ... | ... |

FIG.4

| OPERATION TARGET | ASSOCIATED TAG |
|---|---|
| OPERATION TAG | ASSOCIATED TAG 1, ASSOCIATED TAG2, ASSOCIATED TAG 3 |
| ... | ... |

| | CURRENT TIMING | 12:00 | 12:30 | ··· | 13:30 |
|---|---|---|---|---|---|
| PATTERN 1 (BL 111) | (ALREADY OPERATED) | OPERATION A | - | - | - |
| PATTERN 2 (BL 112) | | OPERATION B | OPERATION A | - | - |
| PATTERN 3 (BL 113) | | OPERATION C | | - | - |
| PATTERN 4 (BL 114) | | OPERATION B | OPERATION B | - | - |
| PATTERN 5 (BL 115) | | OPERATION B | OPERATION C | - | - |

INFORMATION PROCESSING DEVICE, PREDICTION METHOD, AND COMPUTER-READABLE RECORDING MEDIUM

CROSS-REFERENCE TO RELATED APPLICATION

The present application claims priority to and incorporates by reference the entire contents of Japanese Patent Application No. 2021-090279 filed in Japan on May 28, 2021.

FIELD

The present invention is related to an information processing device, a prediction method, and a computer-readable recording medium.

BACKGROUND

In various types of plants in which petroleum, petrochemistry, chemistry, or gases are used; the safe operation of the plants is carried out by the workers (or the operators). For example, based on the actual measurement values such as the temperature and the pressure in a plant that are obtained from various types of sensors such as thermometers and flowmeters installed in the plant; a worker figures out the trend of the functioning of the plant, and accordingly operates the control devices such as valves and heaters installed in the plant. Meanwhile, in the application concerned, the operations also include manual operations performed at the site.

In recent years, from a real plant (hereinafter, sometimes referred to as an actual plant), the plant data such as sensor values, actual measurement values, and control values are obtained in real time, and a simulated plant or a virtual plant is operated; so that, using the virtual plant (hereinafter, sometimes referred to as a mirror plant) that follows the operational condition of the actual plant, the operational support or education of the workers (or the operators) is carried out.

[Patent Literature 1] Japanese Patent Application Laid-open No. 2009-9301

[Patent Literature 2] Japanese Patent Application Laid-open No. 2011-8756

SUMMARY

In a mirror plant, the operational state of the actual plant is predicted by performing simulation using the plant data of the actual plant that also contains the manual operations performed at the site of the plant. However, on the basis of the prediction result, there are times when a worker decides on the operation details according to the experience or the subjective view. Hence, there is a possibility of the worker failing to select more efficient operation or safer operation.

It is an objective of the present invention to enable safe and efficient operation of a plant.

According to an aspect of the embodiments, an information processing device includes, a predicting unit that regarding each of a plurality of operation patterns virtually generated in regard to operation performed by a worker with respect to an actual plant, uses plant data related to operation of the actual plant and uses a virtual plant which follows the actual plant, and predicts state transition of the actual plant in case of implementing each of the plurality of operation patterns, and a display control unit that outputs each of the plurality of operation patterns in a corresponding manner to state transition of the actual plant as obtained by the virtual plant.

According to an aspect of the embodiments, a prediction method includes, predicting, regarding each of a plurality of operation patterns virtually generated in regard to operation performed by a worker with respect to an actual plant, that includes using plant data related to operation of the actual plant and using a virtual plant which follows the actual plant, and predicting state transition of the actual plant in case of implementing each of the plurality of operation patterns, and outputting each of the plurality of operation patterns in a corresponding manner to state transition of the actual plant as obtained by the virtual plant.

According to an aspect of the embodiments, a computer-readable recording medium stores therein a prediction program that causes a computer to perform a process including, predicting, regarding each of a plurality of operation patterns virtually generated in regard to operation performed by a worker with respect to an actual plant, that includes using plant data related to operation of the actual plant and using a virtual plant which follows the actual plant, and predicting state transition of the actual plant in case of implementing each of the plurality of operation patterns, and outputting each of the plurality of operation patterns in a corresponding manner to state transition of the actual plant as obtained by the virtual plant.

BRIEF DESCRIPTION OF THE DRAWINGS

FIG. 3 is a diagram illustrating an example of the information stored in a system DB;

FIG. 4 is a diagram illustrating an example of the information stored in a relevance DB;

DESCRIPTION OF EMBODIMENTS

Figure 1:
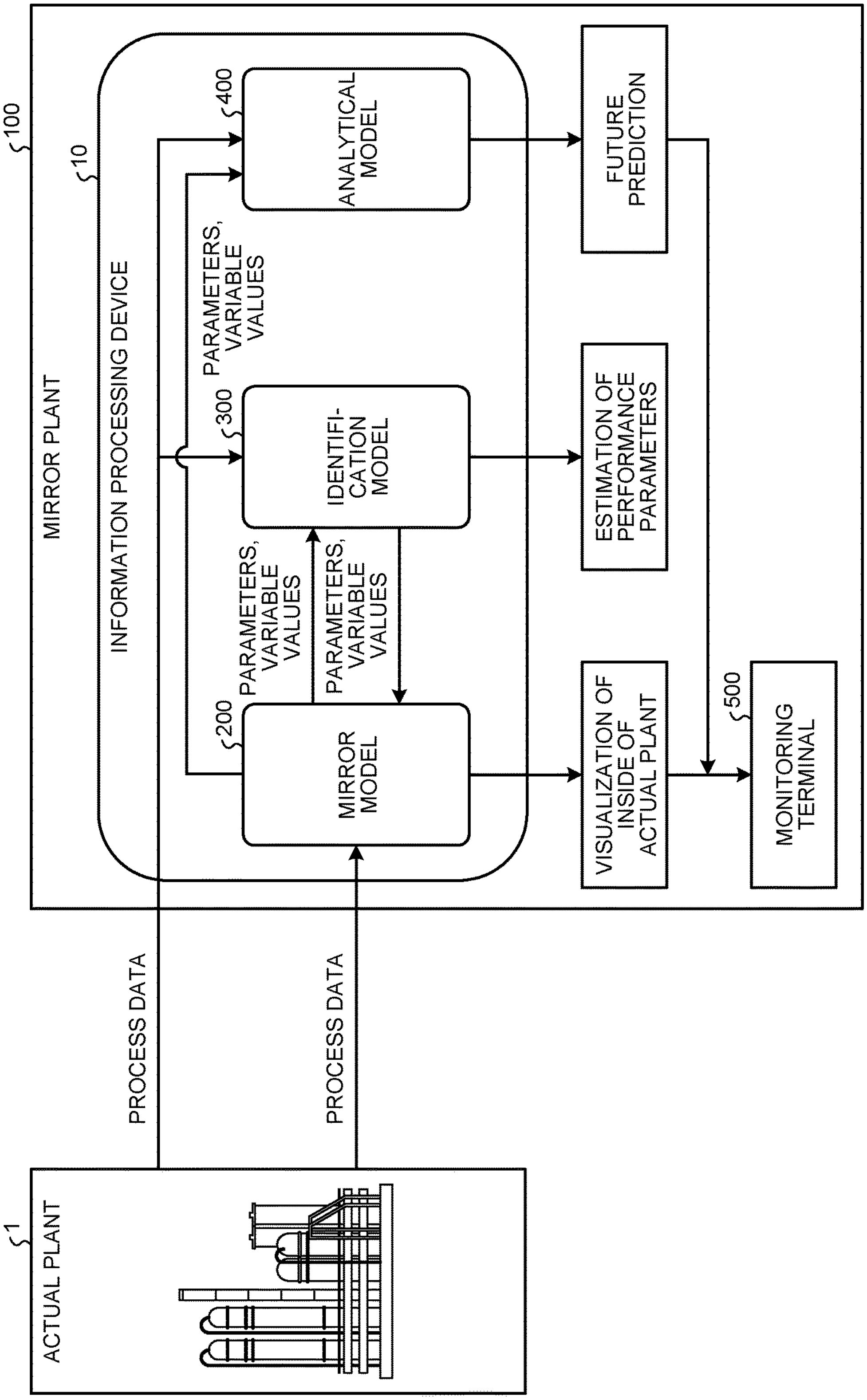
FIG. 1 is a diagram illustrating an exemplary overall configuration of a system according to a first embodiment.

Exemplary embodiments of an information processing device, a prediction method, and a computer-readable recording medium disclosed in the application concerned are described below in detail with reference to the accompanying drawings. However, the present invention is not limited by the embodiments described below. Moreover, identical constituent elements are referred to by the same reference numerals, and the same explanation is not given again. Furthermore, the embodiments can be appropriately combined without causing any contradictions.

First Embodiment

Overall Configuration

FIG. 1 is a diagram illustrating an exemplary overall configuration of a system according to a first embodiment. As illustrated in FIG. 1, the system includes an actual plant 1 and a mirror plant 100. In the system, a virtual plant is built by following the state of the actual plant 1 in real time, and accordingly the safe operation of the actual plant 1 is carried out. The actual plant 1 is built in the real world using actual devices. The mirror plant 100 is a virtual plant that is built in the virtual space (cyber space) using software and that follows the actual plant 1. The actual plant 1 and the mirror plant 100 are connected to each other via a network using a wired connection or a wireless connection.

The actual plant 1 represents an example of various types of plants in which petroleum, petrochemistry, chemistry, and gases are used. The actual plant 1 can be a factory having various facilities for obtaining a product material. Examples of the product material include liquified natural gas (LNG), resin (plastic or nylon), and a chemical product. Examples of the facility includes a factory facility, a machinery facility, a production facility, a power generation facility, a storage facility, and a facility at the well site for extracting crude oil or natural gas.

The inside of the actual plant 1 is built using a distributed control system (DCS). For example, although not illustrated in the drawings, a control system in the actual plant 1 makes use of the process data used in the actual plant 1 and performs a variety of control with respect to the control devices, such as the field devices installed at the target facilities for control, and the operating devices corresponding to the target facilities for control.

A field device is an on-site device that is equipped with the measurement function for measuring the operating state of the corresponding facility (for example, measuring the pressure, the temperature, and the flow volume), and that is equipped with a control function (for example, an actuator) for controlling the operations of the corresponding facility according to the input control signals. A field device such as a sensor treats the operating state of the corresponding facility as the process data and sequentially outputs the process data to a controller in the control system. Then, according to the control signals computed in the controller, a field device such as an actuator controls the operations of the processes.

The process data contains measured values (process variables (PVs)), setting values (setting variables (SVs)), and manipulated variables (MVs). Moreover, the process data also contains information about the types of the measured values to be output (for example, the pressure, the temperature, and the flow volume). Furthermore, the process data is linked with information such as a tag name that is attached for enabling identification of the corresponding field device. The measured values output as the process data need not only include the measured values measured by the sensors representing field devices; but can also include the calculated values calculated from the measured values, and can also include manipulated variable values with respect to actuators representing field devices. The calculation of the calculated values from the measured values can be performed either by a field device or by an external device (not illustrated) that is connected to a field device.

The mirror plant 100 includes a mirror model 200, an identification model 300, and an analytical model 400; and represents a virtual plant that follows the state of the actual plant 1 in real time. In the mirror plant 100, in addition to installing the various devices also installed in the actual plant 1, for example, it is possible to install, in a virtual manner (using software), devices at places such as places having a high temperature or places having a high altitude at which the devices cannot be installed in the actual plant 1, or it is possible to install, in a virtual manner, devices that were not installed due to cost concerns. Hence, the mirror plant 100 becomes able to provide effective services for operating the actual plant 1 in a more accurate and stable manner. Meanwhile, the following explanation is given about the case in which various models are implemented in an information processing device 10. However, that is not the only possible case, and each model can be implemented in a different device.

The mirror model 200 performs operations in synchronization with and in parallel with the actual plant 1; and performs simulation while obtaining data from the actual plant 1, so as to simulate the behavior of the actual plant 1. At the same time, the mirror model 200 estimates the state quantity not measured in the actual plant 1, and creates a visualization of the inside of the actual plant 1. As an example, the mirror model 200 is a physical model that obtains the process data of the actual plant 1, and performs real-time simulation. That is, the mirror model 200 creates a visualization of the state of the actual plant 1. For example, the mirror model 200 incorporates the process data obtained from the actual plant 1; follows the behavior of the actual plant 1; and outputs the result to a monitoring terminal 500. Thus, the mirror model 200 can also take into account the devices not installed in the actual plant 1; predict the behavior of the actual plant 1 after a worker has performed a particular operation; and provide the prediction result to the supervisor.

The identification model 300 periodically estimates the performance parameters of the devices based on the data obtained from the actual plant 1, in order to match the mirror model 200 to the actual measurement data of the actual plant 1. As an example, the identification model 300 is a physical model for adjusting the error between the mirror model 200 and the actual plant 1. That is, the identification model 300 adjusts the parameters of the mirror model 200 either on a periodic basis or as may be necessary when there is an increase in the error between the mirror model 200 and the actual plant 1. For example, the identification model 300 obtains, from the mirror model 200, the values of various parameters and variables indicating the performance; updates those values; and outputs the updated values to the mirror model 200. As a result, the values of the parameters and the variables of the mirror model 200 get updated. The values of the parameters and the variables include design data and operating data.

The analytical model 400 predicts the future operating state of the actual plant 1 based on the behavior of the actual plant 1 as simulated by the mirror model 200. For example, the analytical model 400 performs steady state prediction, transient state prediction, and preventive diagnosis (malfunctioning diagnosis). As an example, the analytical model 400 is a physical model that performs simulation for analyzing the state of the actual plant 1. That is, the analytical model 400 performs future prediction about the actual plant 1. For example, the analytical model 400 can perform high-speed calculation using, as the initial values, the parameters and the variables obtained from the mirror model 200; predict the behavior of the actual plant 1 over the period spanning from a few minutes to a few hours from the present time; and display the prediction in the form of a trend graph.

In such a system, regarding each of a plurality of operation patterns virtually generated in relation to the operations performed by a worker in the actual plant 1; the information processing device 10 performs simulation using the plant data, and predicts the state transition of the actual plant 1 in response to the implementation of the concerned operation pattern. Then, the information processing device 10 outputs the operation patterns in a corresponding manner to the state transitions of the actual plant 1 that are obtained via simulation. As a result, the information processing device 10 becomes able to present, to the worker, the choice of more efficient operation or safer operation. That enables safe and efficient operation of the plant.

Moreover, the information processing device 10 performs simulation using the plant data related to the operation of the actual plant 1, and obtains the information related to various alarms (prediction alarms) which indicate that the predicted state of the actual plant 1 is outside the scope of the predefined state. Then, based on the relationship of the alarms on the basis of the information thereabout, the information processing device 10 performs display control for displaying the alarms in the monitoring terminal 500, which is used for monitoring the mirror plant 100. Thus, by predicting the occurrence of an alarm in the mirror plant 100 that follows the actual plant 1, the information processing device 10 becomes able to reduce the time required for detecting the malfunctioning in the actual plant 1 or for identifying the cause of the malfunctioning in the actual plant 1.

Functional Configuration

Figure 2:
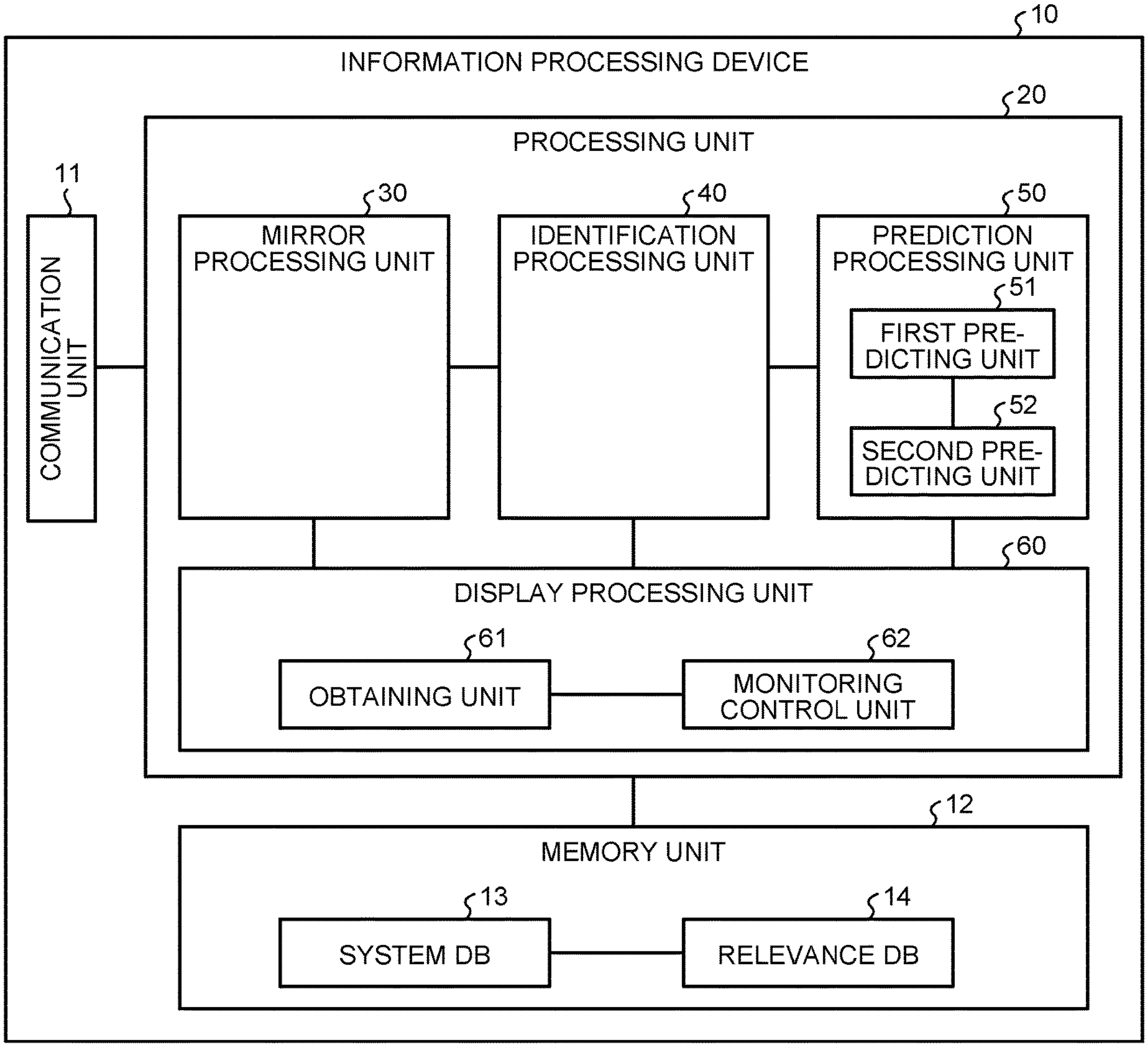
FIG. 2 is a functional block diagram illustrating a functional configuration of an information processing device according to the first embodiment.

FIG. 2 is a functional block diagram illustrating a functional configuration of the information processing device 10 according to the first embodiment. As illustrated in FIG. 2, the information processing device 10 includes a communication unit 11, a memory unit 12, and a processing unit 20.

The communication unit 11 is a processing unit that controls the communication with other devices, and is implemented using, for example, a communication interface. For example, the communication unit 11 controls the communication among actual plants, and obtains plant data in real time. Moreover, the communication unit 11 sends a variety of information to the monitoring terminal 500 for display purpose.

The memory unit 12 is a processing unit that is used to store a variety of data and to store computer programs to be executed by the processing unit 20. The memory unit 12 is implemented using, for example, a memory or a hard disk. The memory unit 12 is used to store a system DB 13 and a relevance DB 14.

The system DB 13 is a database for storing the system structure of the devices and the facilities installed in the actual plant 1. For example, the system DB 13 is used to store a list of devices in the upstream-downstream relationship based on the installation positions of the devices, the path of the product material, and the path of the plant data. Herein, the devices are not limited to the devices installed in the actual plant 1, and can also include the devices that are virtually installed in the mirror plant 100.

FIG. 3 is a diagram illustrating an example of the information stored in the system DB 13. As illustrated in FIG. 3, the system DB 13 is used to store a system 1, a system 2, a system 3, . . . , a system N. Regarding each system, greater the reference numeral, the more downstream is the position of that system. Thus, in the example illustrated in FIG. 3, it is illustrated that a facility A is positioned on the most upstream side; a facility B is positioned on the downstream side of the facility A; and a facility C is positioned on the downstream side of the facility B. Moreover, in the example illustrated in FIG. 3, it is indicated that a device X is positioned on the most upstream side; devices Y and Q are positioned on the downstream side of the device X; and a device Z is positioned on the downstream side of the device Y.

Meanwhile, the information stored in the system DB 13 can be generated in advance by the administrator, or can be generated automatically by analyzing the design specifications of the actual plant 1 or the mirror plant 100.

The relevance DB 14 is a database for storing the relevance of the process data (tags). FIG. 4 is a diagram illustrating an example of the information stored in the relevance DB 14. As illustrated in FIG. 4, the relevance DB 14 is used to store an item "operation target" in a corresponding manner to an item "associated tag". The item "operation target" represents the device operated by the worker. For example, the temperature of a facility, the settings of a flowmeter, the opening-closing of a valve corresponds to the item "operation target". The item "associated tag" represents the devices that get affected by the operation target. As a specific example, the item "associated tag" includes identical devices to the operation targets and includes software sensors. In the example illustrated in FIG. 4, it is illustrated that "associated tag 1", "associated tag 2", and "associated tag 3" get affected due to an operation performed with respect to the "operation tag".

The processing unit 20 is a processing unit that controls the information processing device 10 in entirety; and is implemented using, for example, a processor. The processing unit 20 includes a mirror processing unit 30, an identification processing unit 40, a prediction processing unit 50, and a display processing unit 60. The mirror processing unit 30, the identification processing unit 40, the prediction processing unit 50, and the display processing unit 60 are implemented using electronic circuits included in the processor or using processes executed by the processor.

The mirror processing unit 30 is a processing unit that creates a visualization of the state of the actual plant 1. More particularly, the mirror processing unit 30 obtains the process data in real time from the actual plant 1; performs real-time simulation using a physical model; and follows the state of the actual plant and creates a visualization thereof. That is, the mirror processing unit 30 uses the mirror model 200 explained above.

The identification processing unit 40 is a processing unit that adjusts the error occurring between the simulation, which is performed by the mirror processing unit 30, and the actual plant 1. More particularly, the identification processing unit 40 updates the values of various parameters and variables used in the simulation performed by the mirror processing unit 30. That is, the identification processing unit 40 generates the identification model 300 explained above.

The prediction processing unit 50 is a processing unit that includes a first predicting unit 51 and a second predicting unit 52; and that performs simulation for analyzing the state of the actual plant 1, and predicts the future state of the actual plant 1. The prediction processing unit 50 uses the analytical model 400 explained above.

The first predicting unit 51 is a processing unit that predicts the behavior of the actual plant 1 over the period spanning from a few minutes to a few hours from the present time, and generates a trend graph. More particularly, the first predicting unit 51 performs simulation of behavior prediction either on a periodic basis, or in response to an instruction issued by a worker (or an operator), or at an arbitrary timing such as when operations are performed in the actual plant 1. Meanwhile, in the first embodiment, a worker (or an operator) is simply referred to as a "worker".

For example, when a worker performs an operation of "setting the temperature of the facility A to 50°" in the actual plant 1 at a timing T; the first predicting unit 51 performs simulation in which the operation information indicating "temperature of facility A=50°" is used as the input, and simulates the state of the actual plant 1 after the timing T. Herein, the simulated state of the actual plant 1 indicates the amount of product material of the actual plant 1, and the state quantity of the actual plant 1 that includes the pressure and the temperature of particular devices affected by the facility A.

Figures 5, 6:
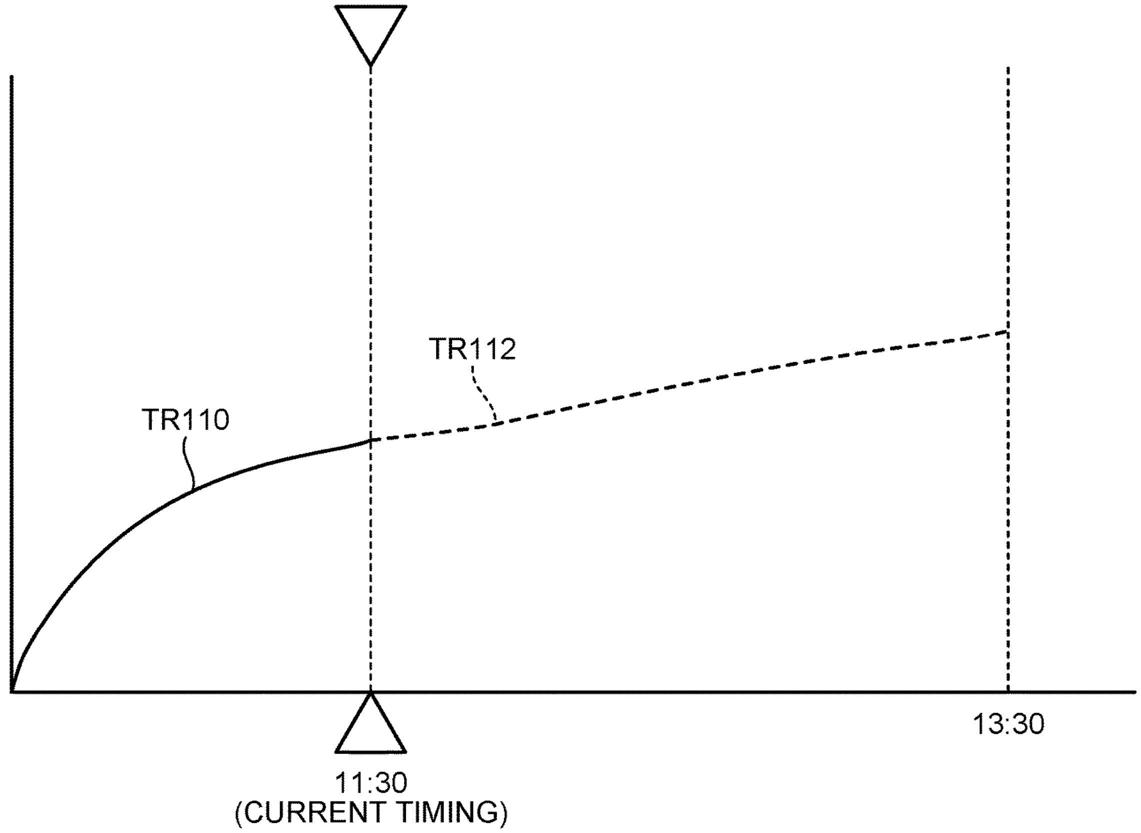
FIG. 5 is a diagram illustrating a trend graph of the state of an actual plant as obtained via simulation.
FIG. 6 is a diagram for explaining an example of generation of a plurality of operation patterns.

FIG. 5 is a diagram illustrating a trend graph of the state of the actual plant 1 as obtained via simulation. As illustrated in FIG. 5, the first predicting unit 51 generates a trend graph in which the horizontal axis represents the time and the vertical axis represents the state of the actual plant 1. In the trend graph illustrated in FIG. 5, TR 110 represents the actual measurement value of the actual plant 1, and TR 112 represents the prediction data after the current timing.

The second predicting unit 52 is a processing unit that performs simulation, using the plant data, regarding each of a plurality of operating patterns virtually generated in relation to the operations performed by a worker with respect to the actual plant 1, and predicts the state transition of the actual plant 1 in response to the implementation of the concerned operation pattern.

More particularly, either when a new operation is performed or at an arbitrary timing at which the actual plant 1 is not steady or makes an unstable behavior, the second predicting unit 52 performs simulation using a physical model generated in advance or using a model identified in the actual plant 1, and predicts the state variation of the actual plant 1 occurring in response to the implementation of a plurality of operating patterns from a particular point of time. At that time, the second predicting unit 52 also becomes able to predict the alarms occurring in each operation pattern or the number of alarms (prediction alarms).

The operations performed by the second predicting unit 52 are explained below in more detail. Firstly, the second predicting unit 52 generates a plurality of virtual operating patterns. More particularly, from an operation manual or from the past operation history, the second predicting unit 52 generates, with respect to a particular tag (operation tag), based on the operational condition of the actual plant 1 at the current timing, virtual operation patterns till a predetermined arbitrary time in the future that can be implemented by the worker. FIG. 6 is a diagram for explaining an example of generation of a plurality of operation patterns. For example, as illustrated in FIG. 6, the second predicting unit 52 generates virtual operation patterns from a pattern 1 to a pattern 5.

The pattern 1 indicates performing only "an operation A at 12:00" after the current timing. The pattern 2 indicates performing "an operation B at 12:00" and performing "the operation A at 12:30" after the current timing. The pattern 3 indicates performing only "an operation C at 12:00" after the current timing. The pattern 4 indicates performing "the operation B at 12:00" and performing "the operation B at 12:30" after the current timing. The pattern 5 indicates performing "the operation B at 12:00" and performing "the operation C at 12:30" after the current timing.

Subsequently, the second predicting unit 52 performs simulation using each operation pattern illustrated in FIG. 6, and predicts the time series variation occurring in the state of the actual plant 1. At that time, the second predicting unit 52 predicts the alarm occurrence count and the alarm occurrence timings of the alarms occurring in each operation pattern; and outputs the predicted states of the actual plant 1 in a corresponding manner to the alarms to the monitoring terminal 500 for display purpose.

Figure 7:
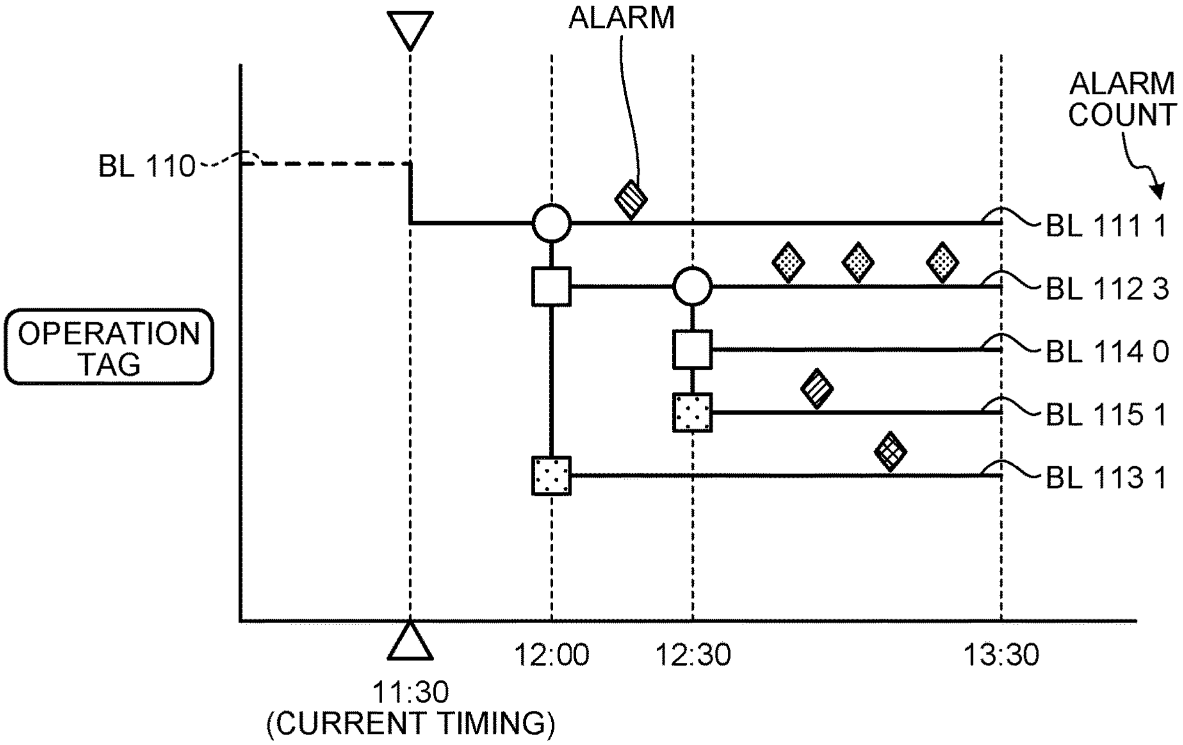
FIG. 7 is a diagram for explaining a display example in which operations of a plurality of operation patterns are displayed and predicted alarms are displayed.

FIG. 7 is a diagram for explaining a display example in which the operations (actions) of a plurality of operation patterns are displayed and the predicted alarms (based on the simulation result) are displayed. In FIG. 7 is illustrated an exemplary screen in which, regarding each of a plurality of operation patterns, the operations with respect to an arbitrary operation tag (for example, the temperature or the degree of opening-closing of a valve) are displayed in chronological order. In FIG. 7, the horizontal axis represents the time. However, the dimensionality is not limited to the two-dimensional space, and can be increased by minutely classifying the state of the prediction target.

As illustrated in FIG. 7, the second predicting unit 52 displays "BL 111" as the time series variation predicted regarding the pattern 1; displays "BL 112" as the time series variation predicted regarding the pattern 2; displays "BL 113" as the time series variation predicted regarding the pattern 3; displays "BL 114" as the time series variation predicted regarding the pattern 4; and displays "BL 115" as the time series variation predicted regarding the pattern 5.

Then, regarding the pattern 1 "BL 111", the second predicting unit 52 predicts and displays the fact that, after the operation A is performed at "12:00", an alarm occurs at around "12:15"; and also displays the fact that the alarm occurrence count is equal to "1". Regarding the pattern "BL 112", the second predicting unit 52 predicts that, after the operation B is performed at "12:00" followed by the operation A at "12:30", an alarm occurs thrice between "12:30" and "13:30, and displays the alarm occurrence timings; and also displays the fact that the alarm occurrence count is equal to "3".

Regarding the pattern 3 "BL 113", the second predicting unit 52 predicts and displays the fact that, after the operation C is performed at "12:00", an alarm occurs at around "13:00"; and also displays the fact that the alarm occurrence count is equal to "1". Regarding the pattern 4 "BL 114", the second predicting unit 52 predicts that, after the operation B is performed at "12:00" and at "12:30", there is no occurrence of an alarm; and displays the fact that the alarm occurrence count is equal to "0". Regarding the pattern 5 "BL 115", the second predicting unit 52 predicts and displays the fact that, after the operation B is performed at "12:00" followed by the operation C at "12:30", an alarm occurs at around "12:45"; and also displays the fact that the alarm occurrence count is equal to "1".

In this way, regarding a plurality of operation patterns that can be implemented by the worker, the second predicting unit 52 can present, to the worker, the alarm occurrence timings and the alarm occurrence count of the alarms occurring for an operation tag such as the temperature. As a result, the worker becomes able to select the best operation pattern having the smallest alarm occurrence count, and put it to use in performing safe operation of the actual plant 1.

Returning to the explanation with reference to FIG. 2, the display processing unit 60 is a processing unit that includes an obtaining unit 61 and a monitoring control unit 62, that performs a variety of control at the time of displaying the screens generated by the mirror processing unit 30 and the prediction processing unit 50.

The obtaining unit 61 is a processing unit that obtains the screens generated by the mirror processing unit 30 and the prediction processing unit 50. For example, the obtaining unit 61 can obtain, with no restrictions on the data format, the trend information generated via simulation by the mirror processing unit 30. In an identical manner, the obtaining unit 61 can also obtain, from the prediction processing unit 50, the alarm occurrence timings and the alarm occurrence count of the alarms occurring in each operation pattern or via simulation. Then, the obtaining unit 61 outputs the obtained information to the monitoring control unit 62.

The monitoring control unit 62 is a processing unit that reshapes a variety of information obtained by the obtaining unit 61, and outputs it to the monitoring terminal 500 for display purpose. For example, the monitoring control unit 62 highlights particular alarms, or suppresses the display of particular alarms, or switches the display, or ends the display of the alarms that have been dealt with. Regarding the details, the explanation is given in subsequent embodiments.

Flow of Trend Display Operation

Figure 8:
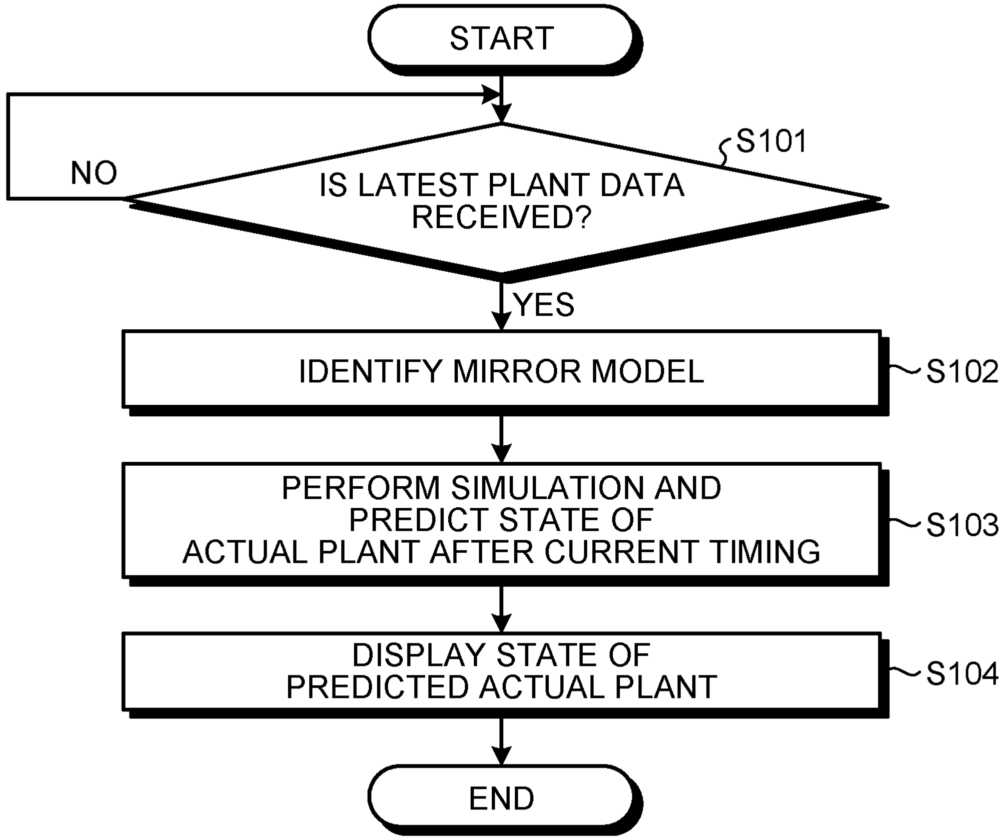
FIG. 8 is a flowchart for explaining the flow of a trend display operation.

FIG. 8 is a flowchart for explaining the flow of a trend display operation. As illustrated in FIG. 8, when the first predicting unit 51 obtains the latest plant data (Yes at S101), the identification model 300 estimates the performance parameters of the devices and performs identification with respect to the mirror model 200 (S102); and the first predicting unit 51 performs simulation to predict the state of the actual plant 1 after the current timing (S103).

Then, the first predicting unit 51 generates a trend graph meant for displaying the prediction result, and outputs the trend graph to the monitoring terminal 500 for display purpose in the format illustrated in FIG. 5 (S104). Meanwhile, the destination for display can be set in an arbitrary manner, such as the monitoring terminal of the actual plant 1, or the smartphone or the mobile terminal of the worker.

Flow of Operation Pattern Display Operation

Figure 9:
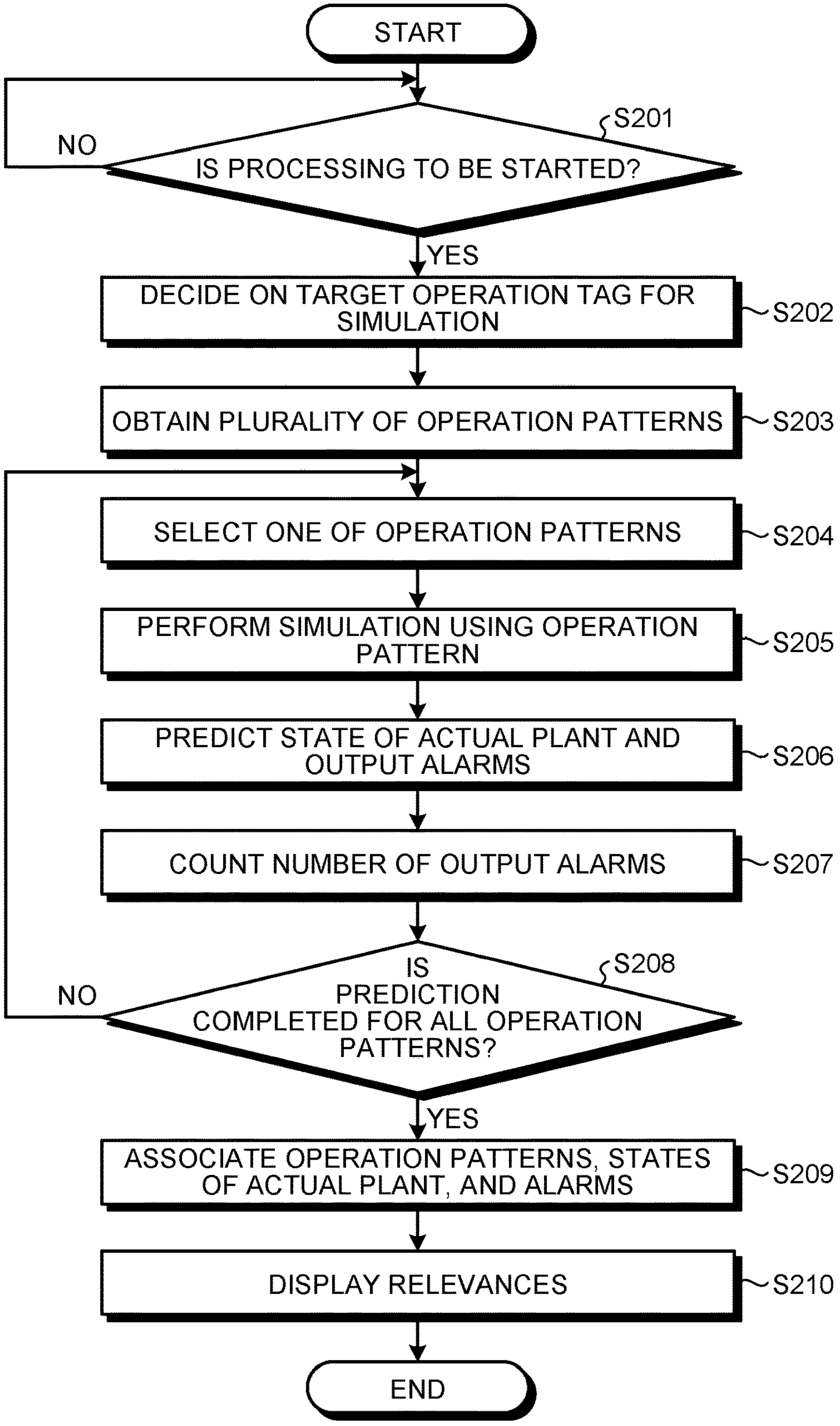
FIG. 9 is a flowchart for explaining the flow of an operation pattern display operation.

FIG. 9 is a flowchart for explaining the flow of an operation pattern display operation. As illustrated in FIG. 9, when the start of processing is instructed (Yes at S201), the second predicting unit 52 decides on the target operation tag for simulation by referring to the instruction from the worker or to the operation manual (S202), and obtains a plurality of operation patterns for the decided operation tag (S203).

For example, based on an operation sequence, the second predicting unit 52 can decide, as the operation tag, the device to be treated as the next target. Meanwhile, a plurality of operation patterns can be generated virtually, or can be input by the worker.

Then, the second predicting unit 52 selects one of the operation patterns (S204) and performs simulation using the selected operation pattern (S205).

Subsequently, the second predicting unit 52 performs simulation, and predicts the state of the actual plant 1 from the current timing till a predetermined time (i.e., predicts the time series variation occurring in the target operation tag) and predicts the output alarms (S206). Moreover, the second predicting unit 52 counts the number of output alarms (S207).

The second predicting unit 52 determines whether or not the prediction is completed for all operation patterns (S208). If there is any operation pattern for which the prediction is not completed (No at S208), then the second predicting unit 52 performs the operations from S204 onward regarding that operation pattern.

When the prediction is completed for all operation patterns (Yes at S208), the second predicting unit 52 associates the operation patterns, the states of the actual plant 1, and the alarms (S209); and outputs and displays the relevances in the format illustrated in FIG. 7 (S210).

Effects

As explained above, the information processing device 10 can predict and output the state of the actual plant 1 in regard to each operation pattern, thereby enabling the worker to select the operation pattern having the smallest alarm occurrence count. As a result, the information processing device 10 becomes able to reduce the possibility of the worker failing to select more efficient operation or safer operation, thereby enabling safe and efficient operation of the plant. Moreover, unlike a simple simulator, the information processing device 10 performs simulation using a model identified in the actual plant 1, and becomes able to obtain a more accurate result.

Furthermore, the information processing device 10 can output the alarm occurrence timings and the alarm occurrence count of the alarms occurring in each operation pattern, thereby enabling safer operation of the plant. Moreover, the information processing device 10 can output, in the form of a graph, the state transition occurring in the actual plant 1 in response to the implementation of each operation pattern, along with the alarm occurrence timings and the alarm occurrence count of the alarms. Hence, the information processing device 10 can present information that enables the worker to make objective decisions, and hence can reduce the possibility of the worker making an improper choice.

Second Embodiment

In the first embodiment, the explanation is given about the case in which prediction is performed with respect to one of the operation tags. However, that is not the only possible case. For example, the information processing device 10 can simultaneously perform prediction with respect to the associated tags that are associated to the operation tag.

More particularly, when each of a plurality of operation patterns is implemented, the information processing device 10 performs simulation, and predicts the occurrence of alarms with respect to a first-type target (an operation tag) from among a plurality of targets for the worker in the actual plant 1, along with simultaneously predicting the occurrence of alarms with respect to at least a single second-type target (an associated tag) that is affected by the operation of the first-type target.

With reference to the example explained above, when an operation tag is selected at S203, the information processing device 10 refers to the relevance DB 14 illustrated in FIG. 4, and identifies "associated tag 1", "associated tag 2", and "associated tag 3" as the associated tags that are associated to the operation tag. Then, the information processing device 10 performs simulation of each of a plurality of operation patterns with respect to the operation tag, as well as performs simulation of each of a plurality of operation patterns with respect to each associated tag.

In this way, the information processing device 10 predicts the variation occurring in the operation tag and predicts the occurrence of alarms in response to the implementation of each operation pattern; as well as predicts the variation occurring in each associated tag and predicts the occurrence of alarms in response to the implementation of each operation pattern. Then, the information processing device 10 can output the prediction results to the monitoring terminal 500 for display purpose.

Figure 10:
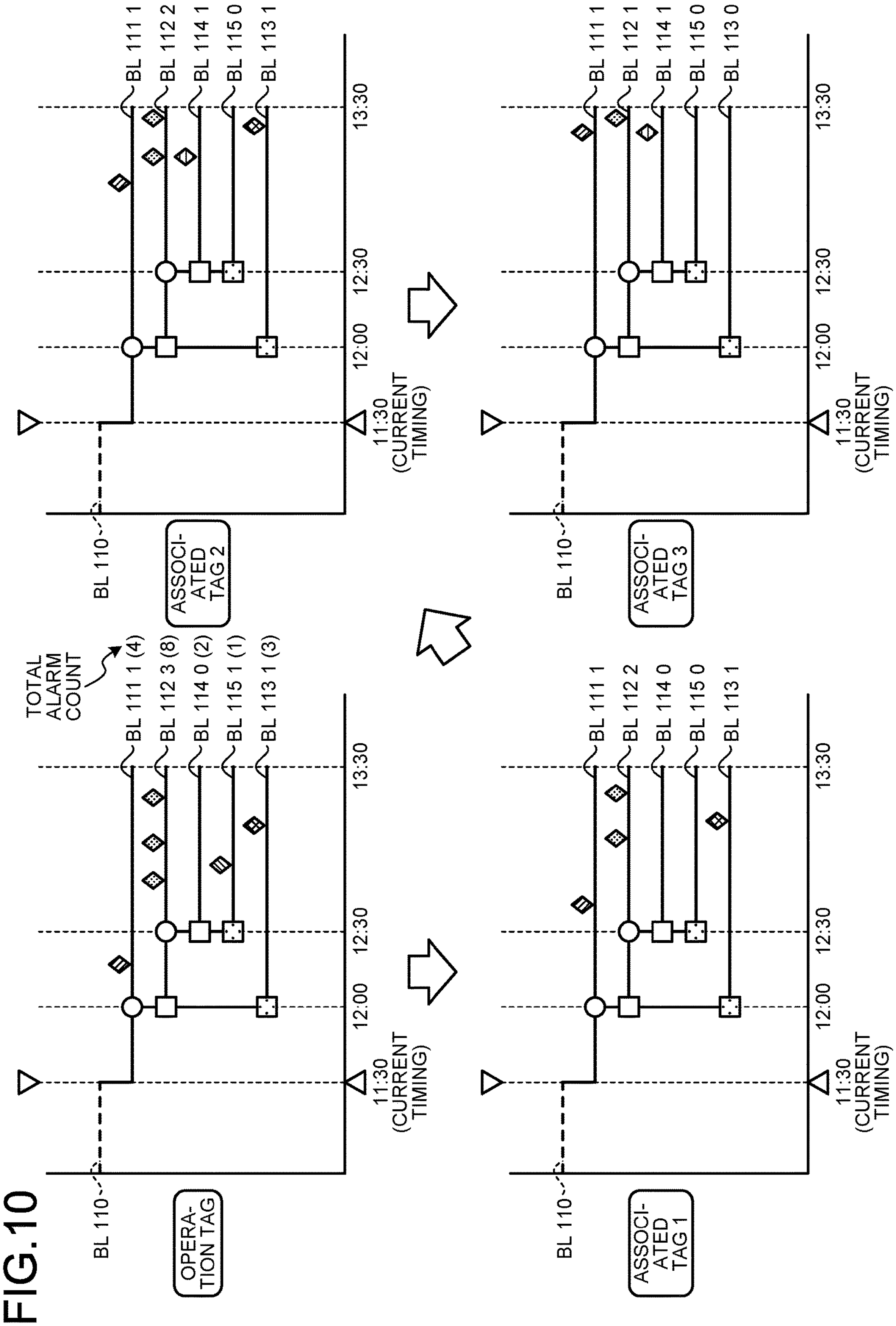
FIG. 10 is a diagram for explaining an example of the display of the operation patterns according to a second embodiment.

FIG. 10 is a diagram for explaining an example of the display of the operation patterns according to the second embodiment. As illustrated in FIG. 10, regarding the operation tag and each associated tag, the second predicting unit 52 of the information processing device 10 displays "BL 111" as the time series variation predicted regarding the pattern 1; displays "BL 112" as the time series variation predicted regarding the pattern 2; displays "BL 113" as the time series variation predicted regarding the pattern 3; displays "BL 114" as the time series variation predicted regarding the pattern 4; and displays "BL 115" as the time series variation predicted regarding the pattern 5. In the associated tags 1 to 3 illustrated in FIG. 10, circles and quadrangles (the operations A to C) are symbols indicating the operations performed with respect to the operation tag, and do not indicate operations performed with respect to the associated tags 1 to 3. Moreover, in the associated tags 1 to 3, diamond symbols (alarms) indicate the alarms occurring in the associated tags.

For example, regarding the pattern 1 "BL 111", the second predicting unit 52 predicts and displays the fact that, after the operation A is performed at "12:00", an alarm occurs at around "12:15" in the operation tag; an alarm occurs at around "12:35" in the associated tag 1; an alarm occurs at around "13:00" in the associated tag 2; and an alarm occurs at around "13:20" in the associated tag 3. Moreover, regarding the operation tag, the second predicting unit 52 displays the alarm occurrence count of "1" and the total alarm occurrence count of "(4)". Furthermore, regarding each of the associated tags 1 to 3, the second predicting unit 52 displays the alarm occurrence count of "1".

In an identical manner, regarding the pattern "BL 112", the second predicting unit 52 predicts and displays the fact that, after the operation B is performed at "12:00" followed by the operation A at "12:30", alarms occur at around "12:45", "13:00", and "13:20" in the operation tag; alarms occur at around "13:00" and "13:20" in the associated tag 1; alarms occur at around "13:10" and "13:25" in the associated tag 2; and an alarm occurs at around "13:25" in the associated tag 3. Moreover, regarding the operation tag, the second predicting unit 52 displays the alarm occurrence count of "3" and the total alarm occurrence count of "(8)". Furthermore, regarding the associated tags 1 to 3, the second predicting unit 52 displays the alarm occurrence count of "2", "2", and "1", respectively.

Regarding the pattern 3 "BL 113", the second predicting unit 52 predicts and displays the fact that, after the operation C is performed at "12:00", an alarm occurs at around "13:15" in the operation tag; an alarm occurs at around "13:15" in the associated tag 1; an alarm occurs at around "13:20" in the associated tag 2; and no alarm occurs in the associated tag 3. Moreover, regarding the operation tag, the second predicting unit 52 displays the alarm occurrence count of "1" and the total alarm occurrence count of "(3)". Furthermore, regarding the associated tags 1 to 3, the second predicting unit 52 displays the alarm occurrence count of "1", "1", and "0", respectively.

Regarding the pattern 4 "BL 114", the second predicting unit 52 predicts that, after the operation B is performed at "12:00" and at "12:30", no alarm occurs in the operation tag and in the associated tag 1. Moreover, the second predicting unit 52 predicts and displays the fact that an alarm occurs at around "13:10" in the associated tag 2, and an alarm occurs at around "13:20" in the associated tag 3. Moreover, regarding the operation tag, the second predicting unit 52 displays the alarm occurrence count of "0" and the total alarm occurrence count of "(2)". Furthermore, regarding the associated tags 1 to 3, the second predicting unit 52 displays the alarm occurrence count of "0", "1", and "1", respectively.

Regarding the pattern 5 "BL 115", the second predicting unit 52 predicts and displays the fact that, after the operation B is performed at "12:00" followed by the operation C at "12:30", an alarm occurs at around "12:45" in the operation tag; and predicts that no alarm occurs in any associated tag. Moreover, regarding the operation tag, the second predicting unit 52 displays the alarm occurrence count of "1" and the total alarm occurrence count of "(1)". Furthermore, regarding each of the associated tags 1 to 3, the second predicting unit 52 displays the alarm occurrence count of "0".

Meanwhile, the second predicting unit 52 can display the prediction screens in a single display; or can display the prediction screens in a switchable manner using the tab of a web screen or a dedicated screen; or can display the prediction screens in a switchable manner using a known switching operation such as swiping. Of course, the second predicting unit 52 is not limited to deal with manual display switching, and can also automatically perform switching in the form of a slideshow.

As explained above, the information processing device 10 not only can output the prediction result for the first-type target (an operation tag), but can also simultaneously predict and output the prediction results for the associated tags. As a result, while holding down the information overload with respect to the worker, the information processing device 10 can narrow down and present the necessary information that contributes in performing safe operation. Moreover, the information processing device 10 can output information that enables the worker to decide on the operation pattern by looking only at the total alarm count displayed with respect to the operation tag (without even looking at the display of the associated tags). Furthermore, the information processing device 10 can highlight the operation pattern having the smallest total alarm count.

Third Embodiment

Meanwhile, if the prediction alarms occur on a frequent basis, it leads to information overload, and the load of visual confirmation on the worker can be expected to increase. Even in such a case, the information processing device 10 can hold down the information overload with respect to the worker by highlighting only particular alarms. In a third embodiment, the alarms occurring for one of the operation patterns are treated as the alarms of the same type.

More particularly, regarding each alarm whose occurrence is predicted via simulation and which indicates that the actual plant 1 is outside the scope of the predefined state; the information processing device 10 performs display control for displaying the alarms in the monitoring terminal 500, which monitors the mirror plant 100, based on the relationship among the alarms. For example, the display processing unit 60 of the information processing device 10 displays the alarms in chronological order according to the anticipated output sequence; and, regarding a plurality of associated alarms of the same type from among the alarms, highlights the initially-output same-type alarm.

Figure 11:
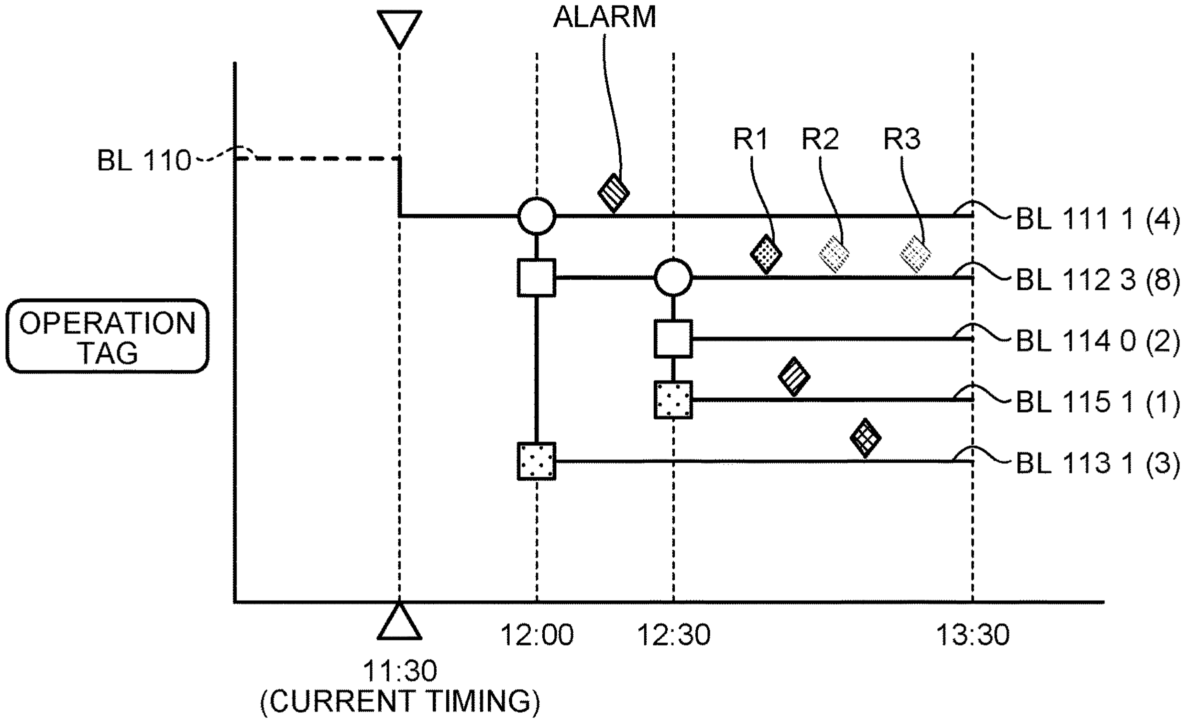
FIG. 11 is a diagram for explaining a first highlighting example of highlighting alarms according to a third embodiment.

FIG. 11 is a diagram for explaining a first highlighting example of highlighting alarms according to the third embodiment. The display example illustrated in FIG. 11 is same as the display example illustrated in FIG. 7. Hence, the detailed explanation is not given again. When the second predicting unit 52 displays the screen, the display processing unit 60 highlights only the initial alarm from among the alarms of the same type. In the example illustrated in FIG. 11, regarding the pattern 2 (BL 112), three same-type alarms (R1, R2, R3) are displayed between "12:30" to "13:30", and the display processing unit 60 highlights the initial alarm R1 from among those alarms.

Figure 12:
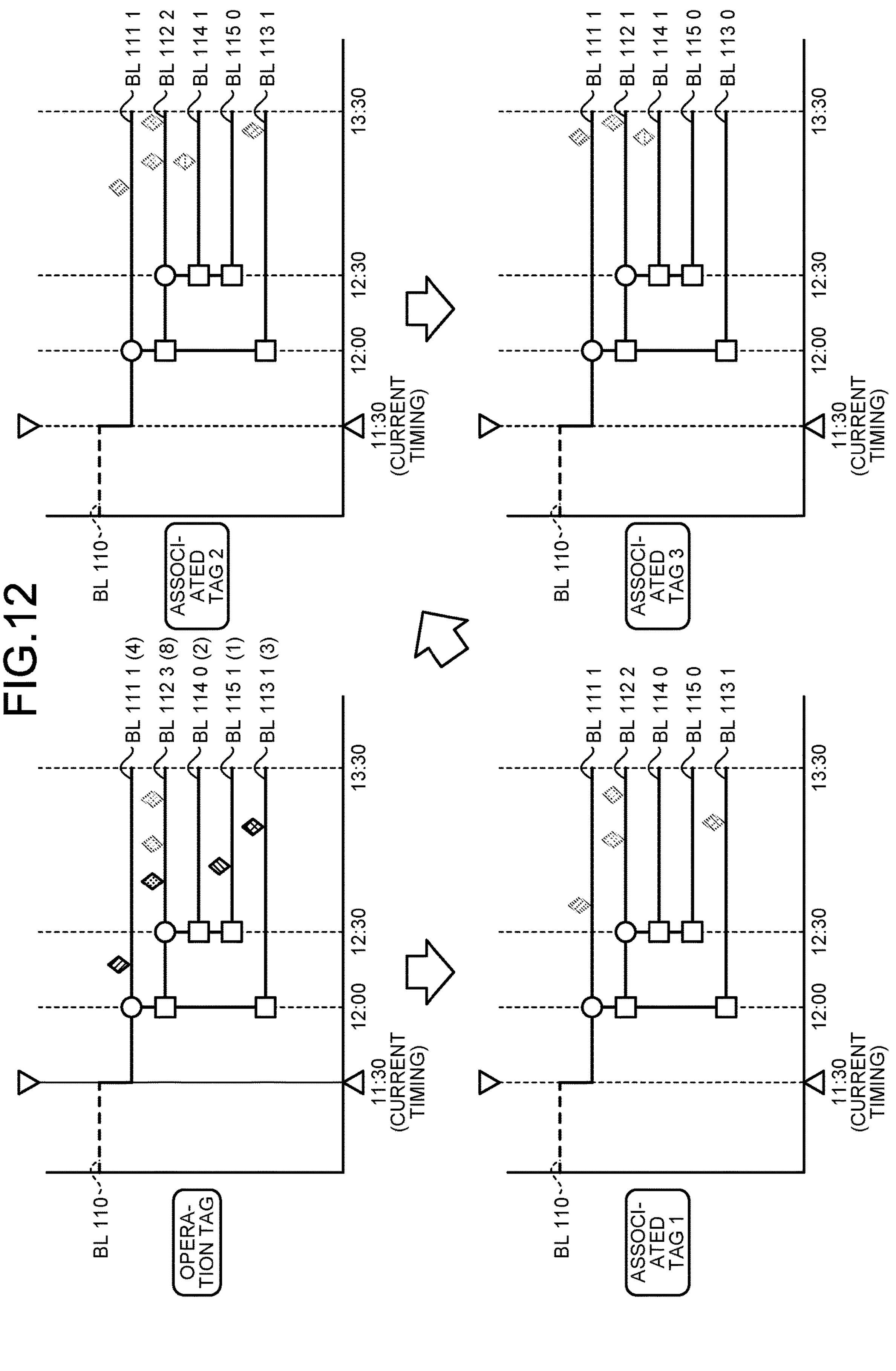
FIG. 12 is a diagram for explaining a second highlighting example of highlighting alarms according to the third embodiment.

Such highlighting can be implemented also for the associated tags. FIG. 12 is a diagram for explaining a second highlighting example of highlighting alarms according to the third embodiment. The display example illustrated in FIG. 12 is same as the display example illustrated in FIG. 10. Hence, that explanation is not given again. When the second predicting unit 52 displays the screen, the display processing unit 60 highlights only the initial alarm from among the same-type alarms in each tag. In the example illustrated in FIG. 12, the display processing unit 60 highlights the initial alarm occurring in each operation pattern for the operation tag, but neither highlights the other alarms occurring in that operation tag nor highlights the alarms occurring in the associated tags.

In this way, by controlling the highlighting, the information processing device 10 can reduce the information overload, thereby enabling achieving improvement in the visibility for the worker.

In the third embodiment, although the explanation is given about the case in which, when the prediction alarms occur on a frequent basis, the initial alarm is highlighted; that is not the only possible case.

Alternatively, for example, from among a plurality of same-type alarms, regarding the same-type alarms other than the initially-output same-type alarm or regarding the same-type alarms occurring after the elapse of a predetermined time since the initially-output same-type alarm, the display processing unit 60 suppresses the display of those alarms.

In the example illustrated in FIG. 11, from among the alarms R1, R2, and R3, the display processing unit 60 suppresses the display of the alarms R2 and R3. In the example illustrated in FIG. 12, for each tag, the display processing unit 60 displays the initially-output alarm occurring in each operation pattern, and suppresses the display of the other alarms.

Meanwhile, the display processing unit 60 either can suppress the display of the alarms occurring within a predetermined period of time (for example, 20 minutes) since the initial alarm; or can display all alarms once and, after the elapse of a predetermined period of time, suppress the display of the alarms other than the initial alarm. Moreover, the display processing unit 60 can display the alarms as far as the upstream devices (for example, the operation tags) are concerned, and can suppress the alarms as far as the downstream devices (for example, the associated tags) are concerned. Herein, suppressing the display of alarms is not limited to not displaying the alarms at all, but also includes changing the colors of the alarms or displaying the alarms in translucent colors.

Fourth Embodiment

As far a predicted alarm is concerned, when the corresponding timing arrives, it is common practice that the worker takes some measures in the actual plant 1 or the mirror plant 100 for avoiding the alarm. In that case, although it is only prediction, the fact remains that a continuous display of the alarms causes a large visual load on the worker. In that regard, in a fourth embodiment, the explanation is given for a case in which, regarding the alarms that occur subsequent to the predicted alarm against which avoidance measures have been taken, the display of those alarms is suppressed and the visual load on the worker is reduced.

Figure 13:
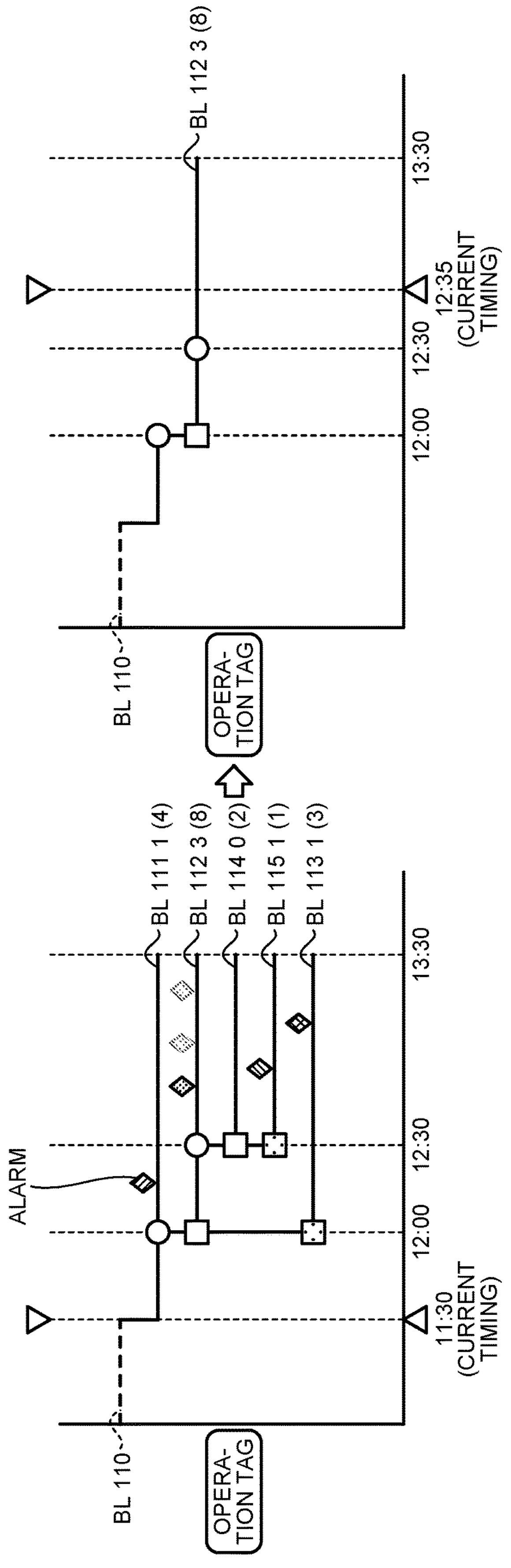
FIG. 13 is a diagram for explaining an example of display suppression of alarms according to a fourth embodiment.

More particularly, after a plurality of same-type alarms is displayed, the information processing device 10 hides the same-type alarms occurring after the timing at which measures were taken by the worker. FIG. 13 is a diagram for explaining an example of display suppression of alarms according to the fourth embodiment. Herein, assume that the screen explained with reference to FIG. 7 is displayed in FIG. 13. In that state, upon detecting the fact the timing has reached "12:35" and that an avoidance operation corresponding to the alarm R1 in the pattern 2 "BL 112" has been performed in the actual plant 1, the display processing unit 60 hides the subsequent alarms R2 and R3. Meanwhile, if an unscheduled operation is performed or added in the BL 112, the information processing device 10 repeats simulation at that point of time and performs display.

As a result, in the information processing device 10, the operations performed with respect to the actual plant 1 can be linked with the display of alarms, and the alarms that are not yet handled can be displayed in a distinguishing manner from the already-handled alarms. That enables achieving enhancement in the visibility for the worker. For example, when measures are taken for an alarm that is attributed to an unscheduled operation with respect to a process, the information processing device 10 can repeat simulation. Moreover, at the time of simply hiding the alarms having low degree of importance, the information processing device 10 can hide the associated alarms too. That is also useful in setting the timing of next prediction. For example, the next prediction can be performed when a predetermined number of alarms disappear. Herein, hiding is not limited to changing the display format of the displayed alarms, but also includes ending the display of the alarms.

Fifth Embodiment

The information processing device 10 can also display the trend display in a comparable manner with the prediction display of the operation patterns. Meanwhile, although the following explanation is given about an operation tag, the identical operations can be performed also for the associated tags.

Figure 14:
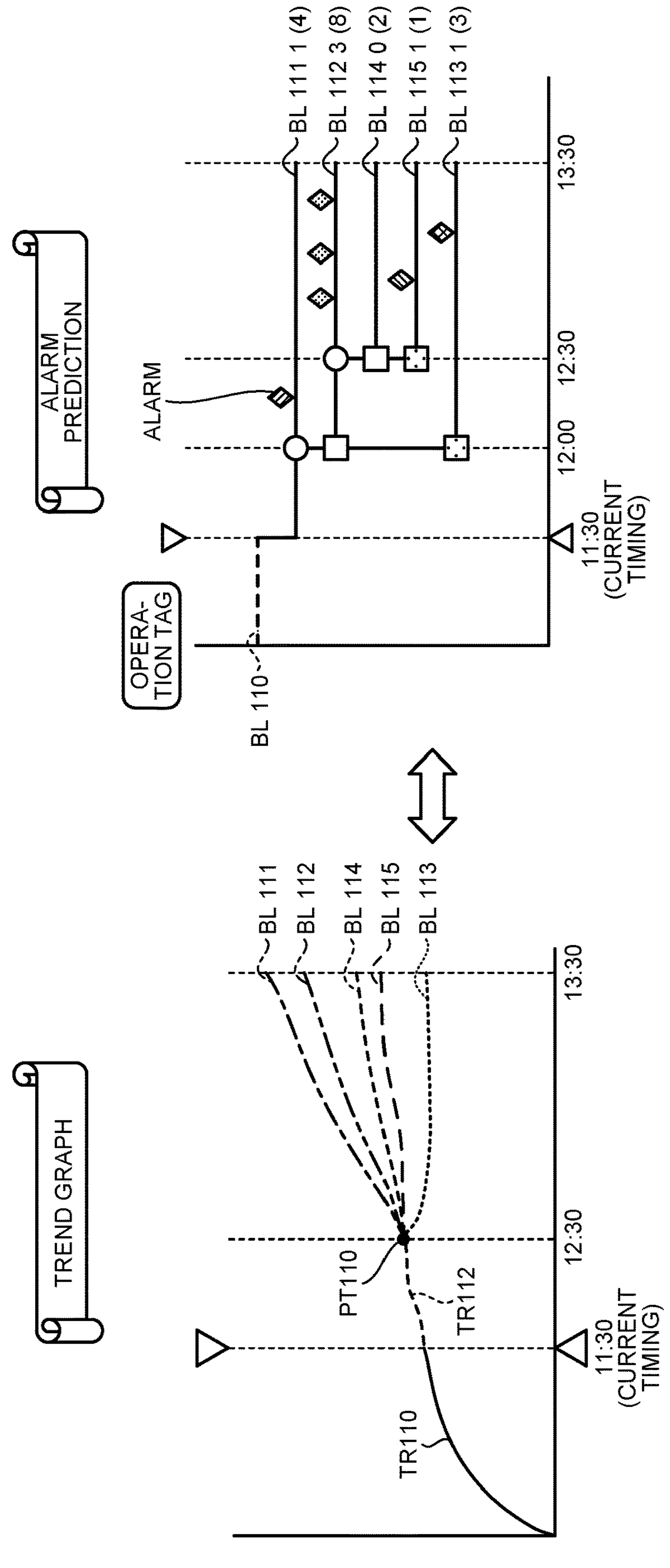
FIG. 14 is a diagram for explaining an example of the coordination with the trend display according to a fifth embodiment.

FIG. 14 is a diagram for explaining an example of the coordination with the trend display according to a fifth embodiment. As illustrated in FIG. 14, with respect to an operation tag, the second predicting unit 52 performs simulation using a plurality of virtual operation patterns (BL 111 to BL 115); predicts the transition of the operation tag and predicts the occurrence of alarms; and displays, in the monitoring terminal 500, a screen including the prediction results. Then, the second predicting unit 52 outputs, as the information related to the operation patterns, the operation details in each operation pattern and the occurrence timings of the alarms to the first predicting unit 51.

Regarding a plurality of operation patterns (BL 111 to BL 115), the first predicting unit 51 uses the operation details in each operation pattern; performs simulation of the operational condition of the entire actual plant 1; and generates an anticipated trend. Then, as illustrated on the right side in FIG. 14, after the already-predicted "12:00", the first predicting unit 51 displays anticipated data of each operation pattern in a trend graph.

As a result, the information processing device 10 becomes able to present, to the worker, the impact of each operation pattern on the entire actual plant 1. With that, the worker becomes able to select the operation pattern that enables operation of the actual plant 1 in a safer way. Hence, it becomes possible to perform safe operation of the actual plant 1.

Sixth Embodiment

Meanwhile, the display control method for the alarms is not limited to the embodiments described above. That is, the display suppression can be performed according to various criteria. In a sixth embodiment, the explanation is given about a different method regarding the display suppression of alarms.

For example, regarding the alarms predicted to occur as a result of the simulation performed with respect to a plurality of operation patterns (i.e., regarding the predicted alarms), the parameters of the tag in which the alarms would occur are intentionally varied, so that the tag (the predicted alarms) that gets impacted can be found and the display of those alarms can be suppressed.

More particularly, the information processing device 10 performs simulation using the mirror model 200; identifies the alarms that are predicted to occur when the value of the prediction process (hereinafter, simply referred to as the prediction process value) exceeds a threshold value; and displays a simulation result screen including those alarms. Then, the information processing device 10 repeats simulation by forcibly setting the prediction process value corresponding to the alarms to be smaller than the threshold value; identifies the alarms that no more occur as a result of repeating the simulation; and suppresses the display of such alarms in the simulation result screen. Meanwhile, in the sixth embodiment, the alarms of the operation tag are treated as an example of first-type alarms; and the alarms of an associated tag are treated as an example of second-type alarms. However, that is not the only possible case. Alternatively, the first-type alarms as well as the second-type alarms can be related to the operation tag; or the first-type alarms as well as the second-type alarms can be related to an associated tag; or the first-type alarms can be related to an associated tag and the second-type alarms can be related to the operation tag.

Figure 15:
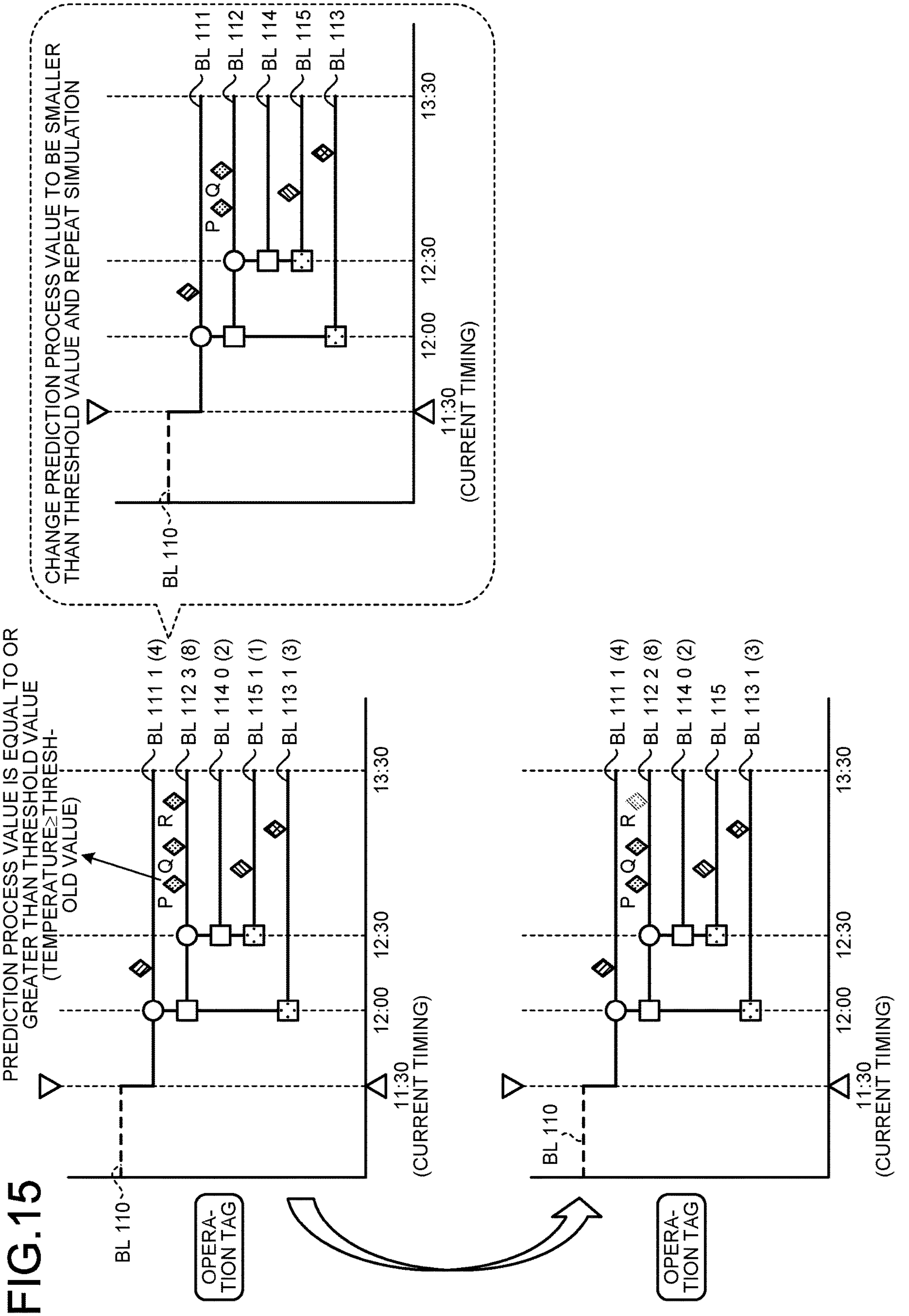
FIG. 15 is a diagram for explaining an example of the suppression of predicted alarms as a result of repeating simulation.

FIG. 15 is a diagram for explaining an example of the suppression of predicted alarms as a result of repeating simulation. Herein, the prediction of alarm occurrence is performed regarding a plurality of operation patterns related to the operation tag explained with reference to FIG. 10. As illustrated in FIG. 15, as a result of performing simulation using the mirror model 200; in the operation pattern BL 112, alarms P, Q, and R are predicted to occur.

In such a state, the prediction processing unit 50 arbitrarily selects the alarm P representing a particular first-type alarm, and obtains the prediction process corresponding to the alarm P from the simulation result. The prediction process is equivalent to, for example, the process values or the sensor values of the actual plant 1, such as the temperature, the humidity, and the pipe flow volume.

Subsequently, the prediction processing unit 50 sets the prediction processing value corresponding to the alarm P to be smaller than the threshold value; repeats simulation using the mirror model 200; and outputs the simulation result. For example, when the alarm P is output because of the prediction that the temperature of 50° is equal to or greater than the threshold value (for example, 40°), the prediction processing unit 50 sets the temperature to 30° and repeats simulation.

The display processing unit 60 identifies that, as a result of repeating simulation, the alarm R is no more displayed. That is, the display processing unit 60 determines that the alarm R is dependent on the alarm P and that dealing with the alarm P results in dealing with the alarm R.

Hence, in the screen in which the alarms P, Q, and R are displayed regarding the operation pattern BL 112, the display processing unit 60 suppresses the display of the alarm R. Meanwhile, the display processing unit 60 either can restore the settings of the prediction process, and then repeat simulation and perform display suppression; or can make changes in the display of the display result of the initial simulation.

Figure 16:
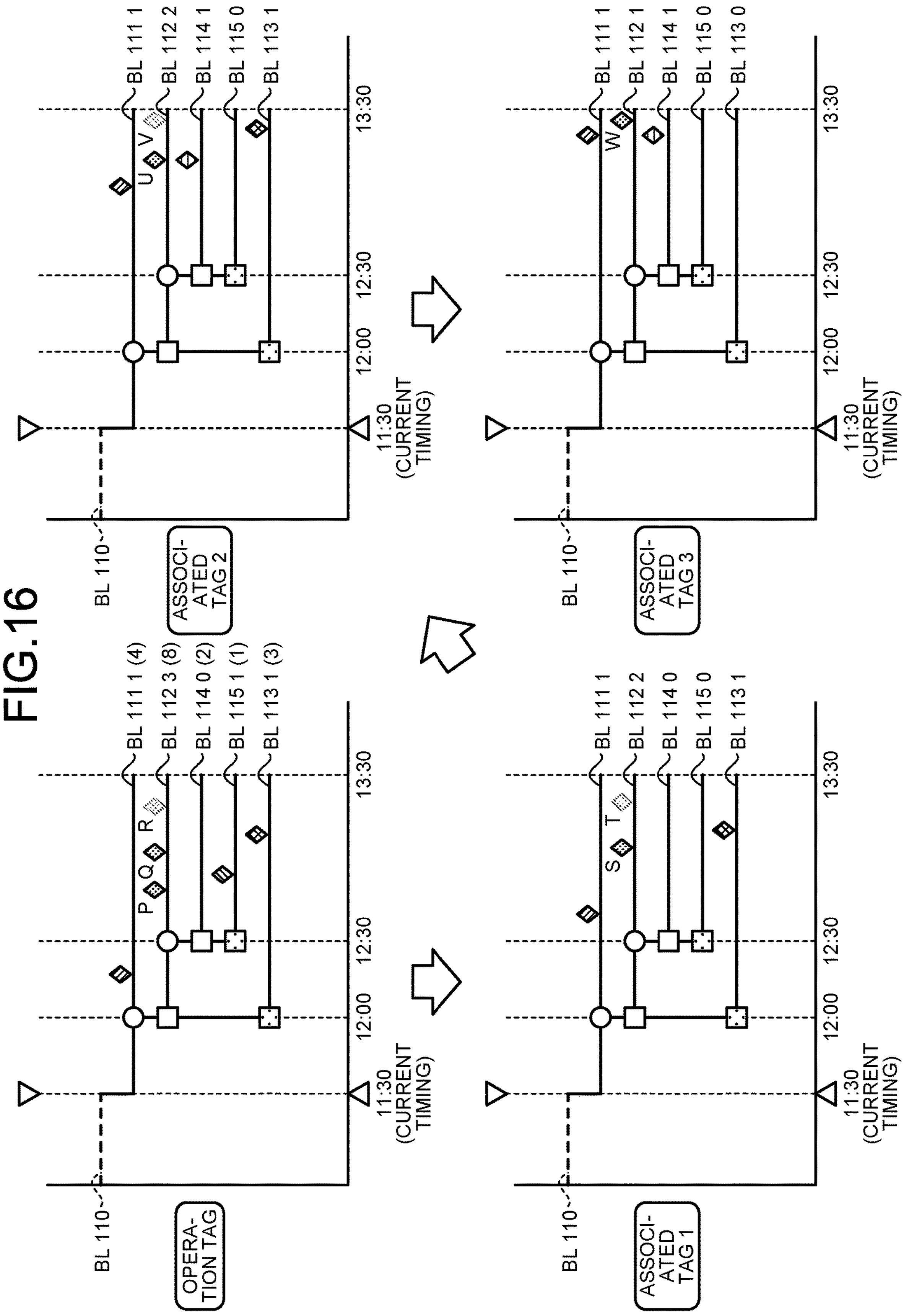
FIG. 16 is a diagram illustrating an example of the suppression of associated alarms as a result of repeating simulation.

With reference to FIG. 15, although the explanation is given about an operation tag, identical operations can be performed regarding the alarms of an associated tag. FIG. 16 is a diagram illustrating an example of the suppression of associated alarms as a result of repeating simulation. In FIG. 16, the prediction of alarm occurrence for the operation tag and the prediction of alarm occurrence for the associated tags is illustrated regarding a plurality of operation patterns related to the operation tag explained with reference to FIG. 10. Herein, although different reference numerals are used, the occurrence of alarms is identical to FIG. 10.

In that state, assume that the prediction processing unit 50 repeats simulation as explained with reference to FIG. 15. At that time, the display processing unit 60 detects that an alarm T occurring in the associated tag 1 and an alarm V occurring in the associated tag 2 are no more displayed. That is, the display processing unit 60 determines that the alarms T and V are dependent on the alarm P and that dealing with the alarm P results in dealing with the alarms T and V.

That is, the display processing unit 60 determines that the alarms T and V are associated alarms of the alarm P. As a result, as illustrated in FIG. 16, the display processing unit 60 suppresses the display of the alarms T and V in the display screen of the initially-simulated alarms.

Meanwhile, in the re-simulation performed after forcible changes are made regarding the alarm P, if none of the alarms occurring in the operation tag and the associated tags are deleted, the same operations can be performed by selecting another alarm. Since the target for re-simulation can be selected in an arbitrary manner, even when the associated alarms are deleted as a result of repeating simulation with respect to a particular alarm, the operations explained with reference to FIG. 15 or FIG. 16 can be performed regarding another alarm.

Meanwhile, although the explanation is given about forcibly changing the prediction processor value, that is not the only possible case. Alternatively, the parameters of the physical model or the formula used in calculating the prediction process value can be changed in such a way that the prediction process value becomes equal to or smaller than the threshold value. Moreover, the target for forcible changes in the settings is not limited to the prediction process value. Alternatively, the sensor value of the software used in the mirror model 200 can be treated as the target for forcible changes in the settings.

Figure 17:
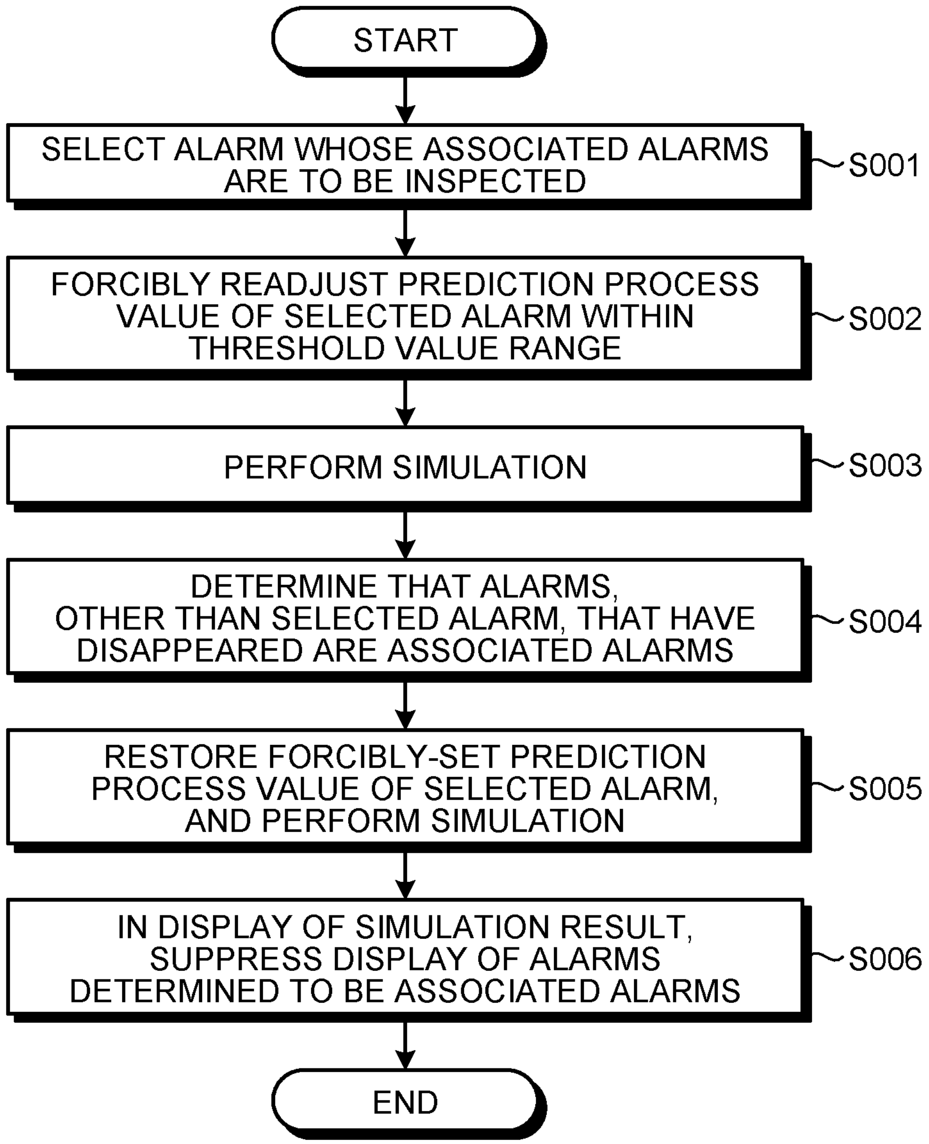
FIG. 17 is a flowchart for explaining the flow of an alarm suppression operation based on re-simulation.

FIG. 17 is a flowchart for explaining the flow of an alarm suppression operation based on re-simulation. As illustrated in FIG. 17, the prediction processing unit 50 selects an alarm whose associated alarms are to be inspected (S001); forcibly readjusts the prediction process value of the selected alarm to be within the threshold value range (S002); and performs simulation in the readjusted state (S003).

Then, the display processing unit 60 determines that the alarms, other than the selected alarm, that have disappeared are the associated alarms (S004). Subsequently, the prediction processing unit 50 restores the prediction process value of the selected alarm and performs simulation (S005); and, in the simulation result display, the display processing unit 60 suppresses the display of the alarms determined to be the associated alarms (S006).

As explained above, the information processing device 10 can perform simulation with respect to a plurality of operation patterns; display the alarms predicted to occur; and identify the alarms having high degree of relevance. Moreover, the information processing device 10 can present, to the worker, information about which alarms get deleted by dealing with which alarms. Hence, the information processing device 10 becomes able to provide information that is useful in enabling the worker to select the most suitable operation pattern.

Seventh Embodiment

In the mirror model 200, the simulation is performed using a model in accordance with the load condition of the actual plant 1 (for example, using an approximation formula). However, it is not practical to generate a model that handles all types of possible loads. Hence, it is possible to think of a method in which a few models are prepared in advance, and simulation is performed while interpolating the models according to the load on the prediction target. That is, it is possible to think that the degree of reliability of the simulation result varies according to the interpolation conditions.

Moreover, depending on the properties of the target elements for modeling, there are elements that can be mathematized in a rigorous way, and there are elements that are handled using an approximation formula matching the actual operations. That is, the accuracy of a model differs according to the elements. Hence, the degree of reliability of simulation changes according to the simulation condition and the model accuracy.

In that regard, at the time of performing simulation with respect to the operation patterns and then displaying alarms, the information processing device 10 presents the degree of reliability of the prediction result to the worker and filters the alarms to be displayed, so as to hold down the information overload with respect to the worker. Meanwhile, in a seventh embodiment, the relationship between the interpolation conditions (the interpolation ratio and the load) and the degree of reliability is defined in advance in a table.

Figure 18:
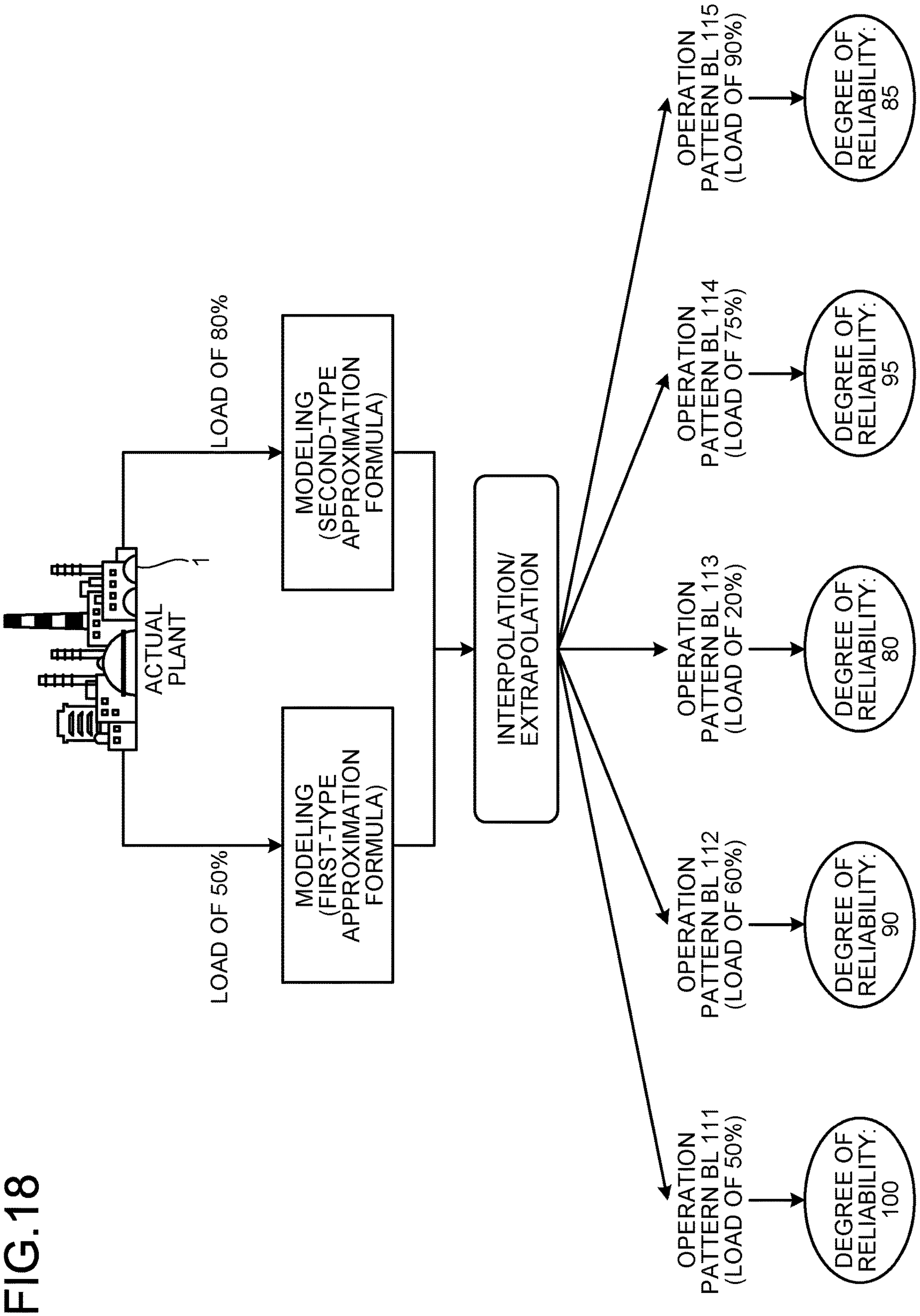
FIG. 18 is a diagram for explaining the degree of reliability of the simulation.

The following explanation about the degree of reliability is given with reference to each operation pattern illustrated in FIG. 10. FIG. 18 is a diagram for explaining the degree of reliability of the simulation. As illustrated in FIG. 18, the information processing device 10 generates and stores, in advance, a model adjusted by assuming the load of 50% on the actual plant 1, and a model adjusted by assuming the load of 80% on the actual plant 1. Herein, the load implies, for example, the load on the processes executed in the actual plant 1, or the volume and the quality of the product material, or the pipe flow volume.

In such a state, in an identical manner to FIG. 10, the prediction processing unit 50 obtains the operation patterns BL 111, BL 112, BL 113, BL 114, and BL 115. The operation pattern BL 111 indicates the operation details assuming the load of 50%; the operation pattern BL 112 indicates the operation details assuming the load of 60%; the operation pattern BL 113 indicates the operation details assuming the load of 20%; the operation pattern BL 114 indicates the operation details assuming the load of 75%; and the operation pattern BL 115 indicates the operation details assuming the load of 90%.

Regarding the operation pattern BL 111, since the operation details correspond to the load of 50%, the prediction processing unit 50 performs simulation using a model corresponding to the load of 50%, and predicts the occurrence of alarms. Thus, the prediction processing unit 50 sets the degree of reliability of the operation pattern BL 111 to "100".

Regarding the operation pattern BL 112, since the operation details correspond to the load of 60%, the prediction processing unit 50 performs simulation using a model obtained as a result of interpolation of a model corresponding to the load of 50% and a model corresponding to the load of 80%, and predicts the occurrence of alarms. Thus, the prediction processing unit 50 sets the degree of reliability of the operation pattern BL 112 to "90".

Regarding the operation pattern BL 113, since the operation details correspond to the load of 20%, the prediction processing unit 50 performs simulation using a model obtained as a result of extrapolation of a model corresponding to the load of 50% and a model corresponding to the load of 80%, and predicts the occurrence of alarms. Thus, the prediction processing unit 50 sets the degree of reliability of the operation pattern BL 113 to "80".

Regarding the operation pattern BL 114, since the operation details correspond to the load of 75%, the prediction processing unit 50 performs simulation using a model obtained as a result of interpolation of a model corresponding to the load of 50% and a model corresponding to the load of 80%, and predicts the occurrence of alarms. Thus, the prediction processing unit 50 sets the degree of reliability of the operation pattern BL 114 to "95".

Regarding the operation pattern BL 115, since the operation details correspond to the load of 90%, the prediction processing unit 50 performs simulation using a model obtained as a result of extrapolation of a model corresponding to the load of 50% and a model corresponding to the load of 80%, and predicts the occurrence of alarms. Thus, the prediction processing unit 50 sets the degree of reliability of the operation pattern BL 115 to "85".

Figure 19:
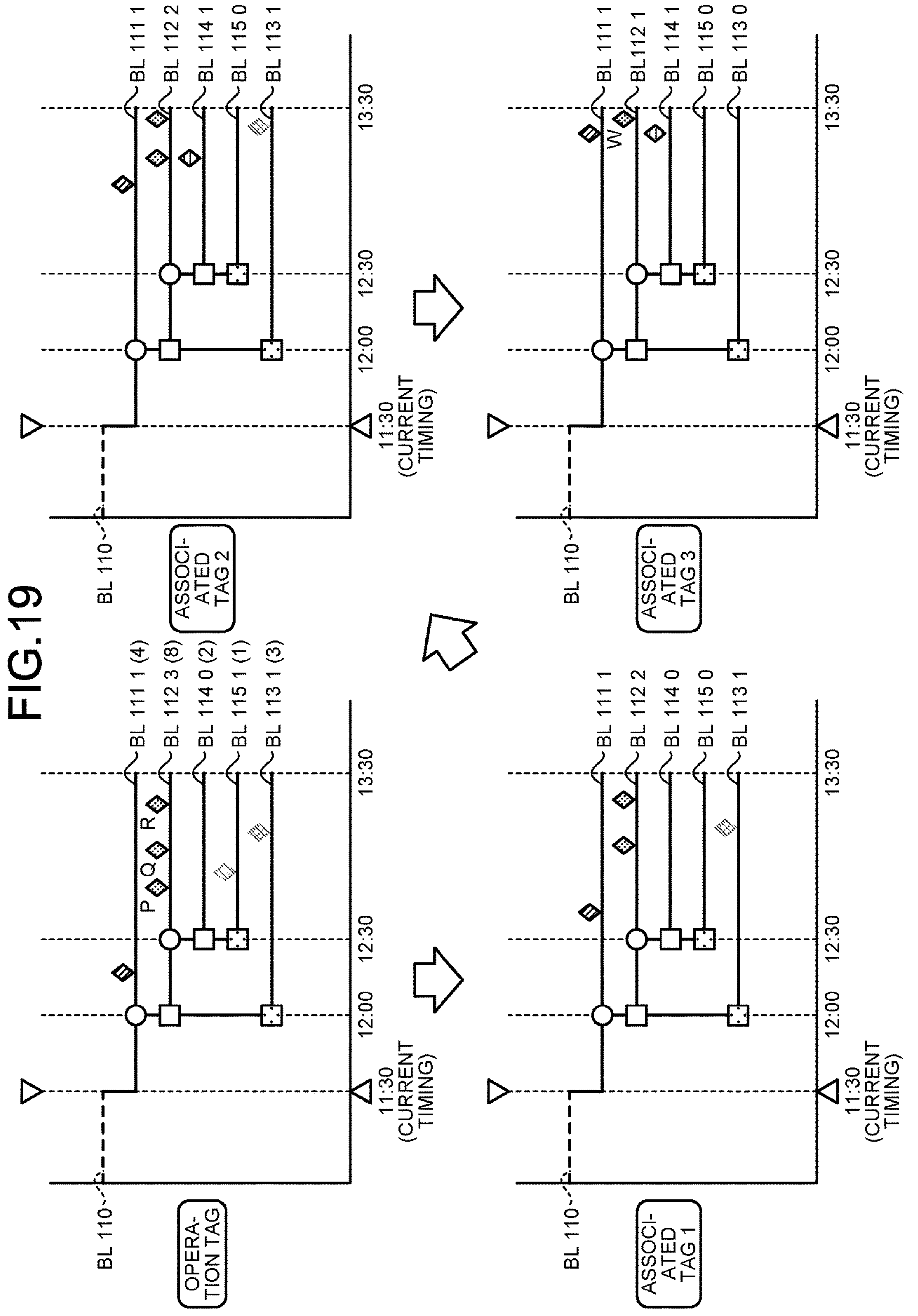
FIG. 19 is a diagram for explaining the display suppression of alarms based on the degrees of reliability.

Then, from among the alarms predicted by performing simulation using each model, the display processing unit 60 suppresses the display of the alarms having the degree of reliability to be smaller than the threshold value (for example, 90). FIG. 19 is a diagram for explaining the display suppression of alarms based on the degrees of reliability. As illustrated in FIG. 19, from among the alarms corresponding to the operation tag, the associated tag 1, the associated tag 2, and the associated tag 3; the display processing unit 60 suppresses the display of the alarms that correspond to the operation patterns BL 113 and BL 115 having the degrees of reliability to be smaller than the threshold value.

Meanwhile, the display suppression of alarms can be performed also by taking into account the degree of importance of the alarms based on risk analysis. For example, regarding the alarms linked to significant events occurring in the remote chance, the display processing unit 60 displays those alarms even if the degree of reliability is low. As another example, the display processing unit 60 decides on whether or not to display an alarm by taking into account the deviation between the target process value (or the alarm threshold value) and the prediction result. For example, when the degree of reliability of the simulation is high, the display processing unit 60 suppresses the display of alarms in the vicinity of the threshold value. However, when the degree of reliability of the simulation is low, the display processing unit 60 displays the alarms in the vicinity of the threshold value.

Figure 20:
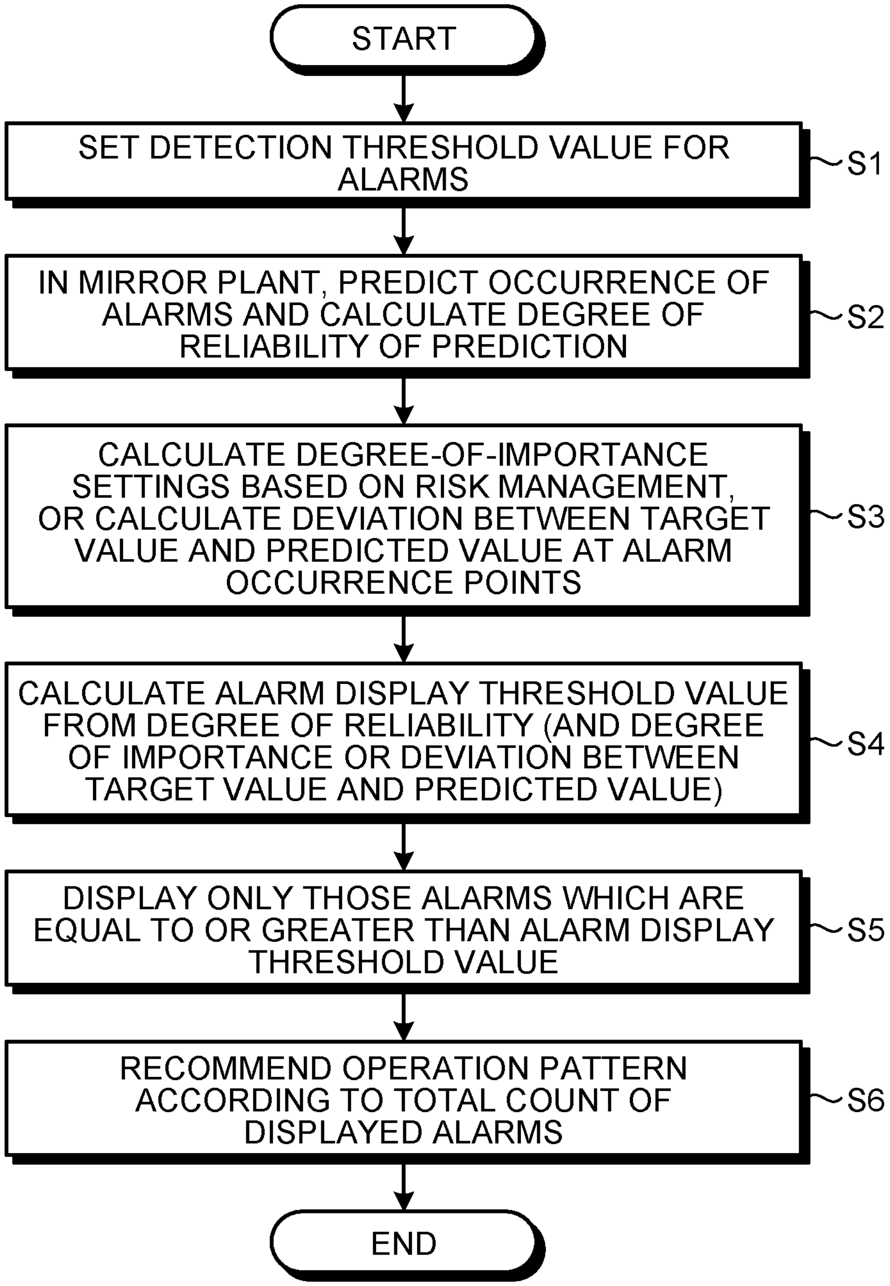
FIG. 20 is a flowchart for explaining the flow of an alarm display control operation based on the degrees of reliability.

FIG. 20 is a flowchart for explaining the flow of an alarm display control operation based on the degrees of reliability. As illustrated in FIG. 20, the information processing device 10 sets a detection threshold value for alarms in response to an instruction issued by the worker (S1).

Then, the information processing device 10 predicts the occurrence of alarms and calculates the degree of reliability of the prediction in the mirror plant 100 (S2). Subsequently, the information processing device 10 calculates the degree-of-importance settings based on risk management, or calculates the deviation between the target value and the predicted value at the alarm occurrence points (S3).

Then, the information processing device 10 calculates an alarm display threshold value from the degree of reliability (and the degree of importance or the deviation between the target value and the predicted value) (S4). For example, the information processing device 10 can calculate the alarm display threshold value also by multiplying, with the rate of decline with reference to the degree of reliability of 100, either a degree of reliability $\alpha$ or the ratio indicating the abovementioned deviation. Alternatively, the information processing device 10 can set the alarm display threshold value in an arbitrary manner.

Then, from among the alarms predicted to occur, the information processing device 10 displays only those alarms which are equal to or greater than the alarm display threshold value (S5), and recommends an operation pattern according to the total count of the displayed alarms (S6). For example, the information processing device 10 recommends the operation pattern having the least number of operations.

Meanwhile, the display suppression of the predicted alarms can be determined using the probability of occurrence of events (alarms), instead of using the degree of reliability of the simulation. For example, if the process is impacted by the weather, then the information processing device 10 calculates the probability of occurrence of alarms by taking into account the precipitation probability after one hour.

More particularly, regarding the alarms related to a process that is impacted by weather conditions such as dust, if there is 50% or more precipitation probability after one hour representing the target period for prediction, the information processing device 10 can display the alarms regardless of the degree of reliability of the model. Moreover, the information processing device 10 can add a predetermined value (for example, 10) to the degree of reliability of the model. On the contrary, in the case of a process related to the temperature that does down due to rain, the information processing device 10 can subtract a predetermined value (for example, 10) from the degree of reliability of the model.

Furthermore, in the case of adapting a machine learning model, the information processing device 10 can obtain the probability of occurrence of the alarms. Hence, depending on the degree of reliability or the probability of occurrence, the information processing device 10 can change the colors or the shading of the alarms.

Eighth Embodiment

Till now, the explanation was given about the embodiments of the present invention. However, other than the embodiments described above, the present invention can be implemented in various other forms.

Numerical Values

The screen display examples, the timings, the tag examples, the system count, the associated tag count, and the alarm count used in the embodiments described above are only exemplary; and can be changed in an arbitrary manner. Moreover, in each type of simulation, a pre-generated physical model can be adapted. Furthermore, in each type of simulation, a machine learning model can be adapted that is generated using training data in which the input (explanatory variables) of the operation details such as the temperature is associated to the output (objective variables) of, for example, the values of the tags.

Meanwhile, the operations explained in the sixth and seventh embodiments are performed with respect to the operation tag and the associated tags. However, that is not the only possible case. Alternatively, the operations can be performed with respect to various target operations and various setting items in the plant. Moreover, in the operations explained in the sixth and seventh embodiments, the target alarms for prediction need not always be limited to the operation tag and the associated tags having known relationship. That is, it is possible to consider operation tags having unknown relationship, or associated tags having unknown relationship, or operation tags and associated tags having unknown relationship.

In the sixth embodiment, the explanation is given about changing the value of the prediction process value and then repeating simulation. However, that is not the only possible case. Alternatively, for example, re-simulation can be performed by changing the parameters of, for example, a simulation model or a machine learning model used in the prediction. Meanwhile, the number of predicted alarms need not be more than one, and there can be one predicted alarm or zero predicted alarms.

In the seventh embodiment, although the explanation is given about using models having different loads, that is not the only possible case. Alternatively, it is possible to use models generated under conditions different than the prediction conditions. For example, instead of limiting the model generation based on the load on the plant, it is possible to use various models generated according to different operation conditions such as environment conditions, including ambient temperature, humidity, and weather, and the skill level of the worker. In that case too, in an identical manner to the seventh embodiment, depending on the difference between the generation conditions of each model and the conditions at the time of alarm prediction, the information processing device 10 decides the degree of reliability of the prediction result to be lower in inverse proportion to the difference. For example, instead of using the interpolation or the extrapolation, the information processing device 10 can use the degree of deviation. As an example, under the prediction condition indicating the ambient temperature of 30°, if a model generated under the condition indicating the ambient temperature of 40° is used for prediction, the information processing device 10 can calculate the degree of reliability of the prediction result to be equal to "100×30/40=75".

Operation Pattern

For example, the operation patterns that are virtually generated by the second predicting unit 52 can be the operation patterns with respect to a particular operation tag, or can be the operation patterns related to the entire actual plant 1 or the entire mirror plant 100 in which a plurality of operation tags is included.

Same-Type Alarm

In the embodiments described above, the explanation is given about the case in which the alarms occurring for one of the operation patterns are treated as the same-type alarms. However, that is not the only possible case. Alternatively, for example, when the physical model is such that the simulation performed by the second predicting unit 52 enables prediction or identification of the cause of occurrence of the alarms, they can be grouped into same-type alarms according to the cause of occurrence.

For example, in the example illustrated in FIG. 11, when the cause of occurrence of the alarms R1 and R3 is same and the cause of occurrence of the alarm R2 is different, the display processing unit 60 suppresses the display of the alarm R3 but does not suppress the display of the alarm R2. The determination according to the cause of occurrence can be implemented in the case in which, for example, the alarms R1 and R3 are generated when the temperature becomes equal to or greater than 70°, and the alarm R2 is generated when the flow volume becomes equal to or smaller than 10 L/min. Such an operation can be implemented in each embodiment. For example, even among the operation tag and the associated tags, the display processing unit 60 can perform display control based on the alarms having the same cause of occurrence.

System

The processing procedures, the control procedures, specific names, various data, and information including parameters described in the embodiments or illustrated in the drawings can be changed as required unless otherwise specified.

The constituent elements of the device illustrated in the drawings are merely conceptual, and need not be physically configured as illustrated. The constituent elements, as a whole or in part, can be separated or integrated either functionally or physically based on various types of loads or use conditions.

The process functions implemented in the device are entirely or partially implemented by a central processing unit (CPU) or by computer programs that are analyzed and executed by a CPU, or are implemented as hardware by wired logic.

Hardware

Figure 21:
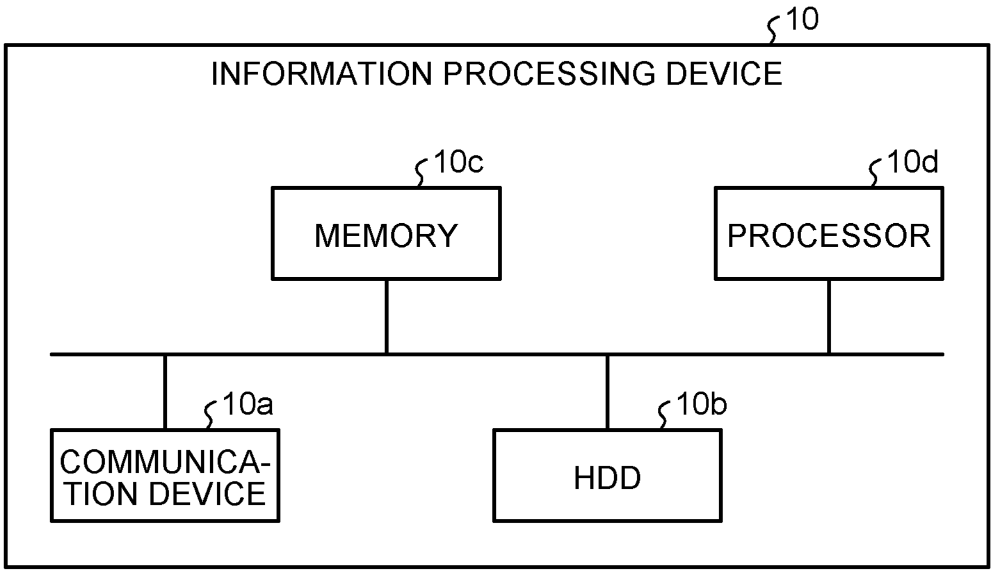
FIG. 21 is a diagram for explaining an exemplary hardware configuration.

Given below is the explanation of an exemplary hardware configuration of the information processing device 10. FIG. 21 is a diagram for explaining an exemplary hardware configuration. As illustrated in FIG. 21, the information processing device 10 includes a communication device 10*a*, a hard disk drive (HDD) 10*b*, a memory 10*c*, and a processor 10*d*. The constituent elements illustrated in FIG. 21 are connected to each other by a bus.

The communication device 10*a* is a network interface card, and performs communication with other servers. The HDD 10*b* is used to store the computer programs and databases meant for implementing the functions illustrated in FIG. 2.

The processor 10*d* reads a computer program, which is meant for executing the operations identical to the processing units illustrated in FIG. 2, from the HDD 10*b*; loads it in the memory 10*c*; and runs processes for implementing the functions explained with reference to FIG. 2. For example, the processes implement the functions identical to the processing units of the information processing device 10. More particularly, the processor 10*d* reads, from the HDD 10*b*, a computer program having the functions identical to the mirror processing unit 30, the identification processing unit 40, the prediction processing unit 50, and the display processing unit 60. Then, the processor 10*d* runs processes for implementing the operations identical to the mirror processing unit 30, the identification processing unit 40, the prediction processing unit 50, and the display processing unit 60.

In this way, the information processing device 10 reads and executes a computer program and operates as an information processing device meant for implementing various processing methods. Moreover, the information processing device 10 can read the abovementioned computer program from a recording medium using a medium reading device, and execute the computer program to implement the functions identical to the embodiments described above. Meanwhile, the computer program explained herein is not limited to be executed by the information processing device 10. Alternatively, for example, also when the computer program is executed by another computer, or by a server, or by such other computers and servers in cooperation; the present invention can be implemented in an identical manner.

The computer program can be distributed via a network such as the Internet. Alternatively, the computer program can be recorded in a computer-readable recording medium such as a flexible disk (FD), a compact disc read only memory (CD-ROM), a magneto-optical disk (MO), or a digital versatile disk (DVD). Then, a computer can read the computer program from the recording medium and execute it.

According to an aspect, the operations of a plant can be carried out in a safe and efficient manner.

What is claimed is:

1. An information processing device comprising a non-transitory memory that stores a computer program including a simulation program, and at least one processor configured to execute the computer program to perform:

obtaining plant data related to an operation in an actual plant connected to the information processing device via a network;

executing the simulation program by using a virtual plant which follows the actual plant to predict a state transition of the actual plant based on the obtained plant data;

displaying the predicted state transition;

obtaining a plurality of operation patterns each including at least one operation;

executing the simulation program to each one of the plurality of operation patterns by using the virtual plant to predict a count of occurrence of an alarm and a timing at which the alarm occurs, the alarm indicating a state of the actual plant that is outside scope of a predefined state of the actual plant; and displaying a screen including the plurality of operation patterns and a text of the predicted count of occurrence of the alarm for each one of the plurality of operation patterns, the plurality of operation patterns including a first operation pattern including a first operation performed at a first timing, and a second operation pattern including a second operation performed at the first timing and a third operation performed at a second timing after the first timing, the first operation pattern, the second operation pattern and the third operation pattern being displayed in chronological order, wherein the simulation program includes a first simulation program using a first load of the actual plant and a second simulation program using a second load of the actual plant different from the first load, each one of the plurality of operation patterns assumes a respective load that is the same as or different from the first load or the second load, and the at least one processor is further configured to execute the computer program to perform:

calculating a degree of reliability of each one of the plurality of operation patterns by interpolating or extrapolating the first load and the second load; and controlling a display of the alarm of the plurality of operation patterns based on the degree of reliability.

2. The information processing device according to claim 1, wherein the at least one processor is further configured to execute the computer program to perform:

executing the simulation program by using the virtual plant to predict, occurrence of the alarm with respect to a first-type target from among a plurality of targets in the actual plant, and occurrence of the alarm with respect to at least one second-type target that is impacted by the operation of the first-type target;

outputting, in a manner corresponding to the first-type target, each of the plurality of operation patterns and the alarm occurring due to each of the plurality of operation patterns; and outputting, in a manner corresponding to the at least one second-type target, each of the plurality of operation patterns and the alarm occurring due to each of the plurality of operation patterns.

3. The information processing device according to claim 1, wherein the at least one processor is further configured to execute the computer program to perform displaying implementation time of various operations with respect to an operation tag included in each operation pattern and occurrence time of various alarms predicted using the virtual plant in a manner corresponding to each one of the plurality of operation patterns, and on identical time axis.

4. The information processing device according to claim 1, wherein the at least one processor is further configured to execute the computer program to perform:

obtaining information related to output of various alarms which are predicted using the virtual plant and which indicate that the actual plant is outside scope of a predefined state; and performing display control of the various alarms on the screen based on relationship of the various alarms on basis of the information related to output of the various alarms.

5. The information processing device according to claim 4, wherein the at least one processor is further configured to execute the computer program to perform:

displaying, in chronological order, the various alarms according to output sequence, and regarding a plurality of same-type alarms related to each other from among the various alarms, highlighting initially-output same-type alarm.

6. The information processing device according to claim 5, wherein the at least one processor is further configured to execute the computer program to perform:

suppressing display of the plurality of same-type alarms other than the initially-output same-type alarm from among the plurality of same-type alarms, or suppressing display of the plurality of same-type alarms output after elapse of predetermined period of time since the initially-output same-type alarm.

7. The information processing device according to claim 5, wherein, after the plurality of same-type alarms are displayed, the at least one processor further configured to execute the computer program to perform hiding the plurality of same-type alarms that occur after timing at which the worker takes measure in the actual plant or the virtual plant.

8. The information processing device according to claim 5, wherein the at least one processor is further configured to execute the computer program to perform extracting, as the plurality of same-type alarms from among the various alarms, the plurality of alarms having same cause of occurrence or the plurality of alarms having positional relationship on upstream side or downstream side with a device that is in the actual plant and that has caused occurrence of the alarms.

9. The information processing device according to claim 5, wherein the at least one processor is further configured to execute the computer program to perform:

obtaining, from the virtual plant, an operation pattern that is predicted by the virtual plant and that is related to the operation to be performed by a worker with respect to the actual plant, and displaying on identical time axis, in chronological order, and in different format for each of the same-type alarms, various operations included in the operation pattern and the various alarms.

10. The information processing device according to claim 1, wherein each one of the first load and the second load of the actual plant includes a load on processes executed by the actual plant, volume or quality of a product material, or a pipe flow volume.

11. The information processing device according to claim 1, wherein the at least one processor is further configured to execute the computer program to perform suppressing displaying the alarm of the plurality of operation pattern having the degree of reliability smaller than a threshold value.

12. The information processing device according to claim 1, wherein the at least one processor is further configured to execute the computer program to perform controlling the display of the alarm of the plurality of operation patterns based on the degree of reliability and a degree of importance of the alarm.

13. A prediction method comprising:

obtaining plant data related to an operation in an actual plant connected to an information processing device via a network;

executing a simulation program stored in a non-transitory memory included in the information processing device, by using a virtual plant which follows the actual plant to predict a state transition of the actual plant based on the obtained plant data;

displaying the predicted state transition;

obtaining a plurality of operation patterns each including at least one operation;

executing the simulation program to each one of the plurality of operation patterns by using the virtual plant to predict a count of occurrence of an alarm and a timing at which the alarm occurs, the alarm indicating a state of the actual plant that is outside scope of a predefined state of the actual plant; and displaying a screen including the plurality of operation patterns and a text of the predicted count of occurrence of the alarm for each one of the plurality of operation patterns, the plurality of operation patterns including a first operation pattern including a first operation performed at a first timing, and a second operation pattern including a second operation performed at the first timing and a third operation performed at a second timing after the first timing, the first operation pattern, the second operation pattern and the third operation pattern being displayed in chronological order, wherein the simulation program includes a first simulation program using a first load of the actual plant and a second simulation program using a second load of the actual plant different from the first load, each one of the plurality of operation patterns assumes a respective load that is the same as or different from the first load or the second load, and the method further comprises:

calculating a degree of reliability of each one of the plurality of operation patterns by interpolating or extrapolating the first load and the second load; and controlling a display of the alarm of the plurality of operation patterns based on the degree of reliability.

14. A non-transitory computer-readable recording medium having stored therein a simulation program that causes a computer to perform a process comprising:

obtaining plant data related to an operation in an actual plant connected to an information processing device via a network;

executing the simulation program, by using a virtual plant which follows the actual plant to predict a state transition of the actual plant based on the obtained plant data;

displaying the predicted state transition;

obtaining a plurality of operation patterns each including at least one operation;

executing the simulation program to each one of the plurality of operation patterns by using the virtual plant to predict a count of occurrence of an alarm and a timing at which the alarm occurs, the alarm indicating a state of the actual plant that is outside scope of a predefined state of the actual plant; and displaying a screen including the plurality of operation patterns and a text of the predicted count of occurrence of the alarm for each one of the plurality of operation patterns, the plurality of operation patterns including a first operation pattern including a first operation performed at a first timing, and a second operation pattern including a second operation performed at the first timing and a third operation performed at a second timing after the first timing, the first operation pattern, the second operation pattern and the third operation pattern being displayed in chronological order, wherein the simulation program includes a first simulation program using a first load of the actual plant and a second simulation program using a second load of the actual plant different from the first load, each one of the plurality of operation patterns assumes a respective load that is the same as or different from the first load or the second load, and the process further comprises:

calculating a degree of reliability of each one of the plurality of operation patterns by interpolating or extrapolating the first load and the second load; and controlling a display of the alarm of the plurality of operation patterns based on the degree of reliability.

* * * * *